(12) United States Patent
Song et al.

(10) Patent No.: US 9,837,158 B2
(45) Date of Patent: Dec. 5, 2017

(54) NONVOLATILE MEMORY DEVICE AND METHOD OF PROGRAMMING THE SAME

(71) Applicant: SK hynix Inc., Gyeonggi-do (KR)

(72) Inventors: Hyun Min Song, Sejong (KR); Jeong Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/012,440

(22) Filed: Feb. 1, 2016

(65) Prior Publication Data

US 2017/0069386 A1    Mar. 9, 2017

(30) Foreign Application Priority Data

Sep. 9, 2015  (KR) .................. 10-2015-0127678

(51) Int. Cl.
| | | |
|---|---|---|
| G11C 16/10 | (2006.01) | |
| G11C 16/26 | (2006.01) | |
| G11C 16/04 | (2006.01) | |
| G11C 16/34 | (2006.01) | |

(52) U.S. Cl.
CPC .......... *G11C 16/10* (2013.01); *G11C 16/0408* (2013.01); *G11C 16/26* (2013.01); *G11C 16/3459* (2013.01); *G11C 16/3481* (2013.01)

(58) Field of Classification Search
CPC ............................ G11C 16/10; G11C 16/0483
USPC ....................................... 365/185.28, 185.24
See application file for complete search history.

(56) References Cited

U.S. PATENT DOCUMENTS

| | | | | | |
|---|---|---|---|---|---|
| 4,866,389 | A | * | 9/1989 | Ryan .................. | G01R 19/0084 324/433 |
| 5,172,196 | A | * | 12/1992 | Matsukawa ......... | H01L 29/7883 257/316 |
| 5,297,077 | A | * | 3/1994 | Imai ...................... | G11C 14/00 365/117 |
| 5,638,320 | A | * | 6/1997 | Wong .................. | G11C 11/5621 365/185.03 |
| 5,852,640 | A | * | 12/1998 | Kliza ....................... | G06F 1/10 327/158 |
| 5,936,888 | A | * | 8/1999 | Sugawara .............. | G11C 16/28 365/185.2 |
| 6,456,532 | B1 | * | 9/2002 | Ohmi .................. | G11C 11/5621 365/185.03 |
| 7,746,693 | B2 | * | 6/2010 | Huang ................. | G11C 27/005 365/185.03 |
| 2002/0051384 | A1 | * | 5/2002 | Cernea ................ | G11C 11/5621 365/185.21 |
| 2005/0030827 | A1 | * | 2/2005 | Gilliland ............ | G11C 16/3404 365/232 |
| 2007/0103131 | A1 | * | 5/2007 | Shin ........................ | H02M 3/07 323/280 |
| 2007/0157722 | A1 | * | 7/2007 | Veerasamy ....... | B32B 17/10036 73/170.21 |

(Continued)

*Primary Examiner* — Michael Tran
(74) *Attorney, Agent, or Firm* — IP & T Group LLP

(57) ABSTRACT

A nonvolatile memory device includes a memory cell, and a switching unit. The memory cell includes a cell transistor having a floating gate and a coupling capacitor connected to the floating gate. The switching unit is coupled between the coupling capacitor and a bias terminal, and switches on or off based on the comparison result between a cell current flowing through the memory cell with a reference current during a program operation for programming the memory cell.

19 Claims, 11 Drawing Sheets

(56) References Cited

U.S. PATENT DOCUMENTS

| | | | |
|---|---|---|---|
| 2008/0007317 A1* | 1/2008 | Bodano | H03K 17/063 327/390 |
| 2009/0175074 A1* | 7/2009 | Theoduloz | G11C 7/08 365/185.2 |
| 2010/0253710 A1* | 10/2010 | Rankov | G09G 3/3233 345/690 |
| 2011/0116320 A1 | 5/2011 | Zhang et al. | |
| 2012/0281324 A1* | 11/2012 | Okushima | H01L 27/0262 361/56 |
| 2014/0063923 A1* | 3/2014 | Jefremow | G11C 11/1673 365/158 |
| 2014/0133214 A1* | 5/2014 | Yim | G11C 13/004 365/148 |
| 2014/0241054 A1* | 8/2014 | Koyama | H01L 27/0688 365/184 |
| 2014/0346506 A1* | 11/2014 | Kimura | H01L 27/1255 257/43 |
| 2014/0369132 A1* | 12/2014 | Cernea | G11C 16/28 365/185.21 |
| 2015/0131376 A1* | 5/2015 | Tsang | G11C 16/26 365/185.03 |
| 2015/0243351 A1* | 8/2015 | Moschiano | G11C 11/5628 365/185.03 |
| 2015/0294706 A1* | 10/2015 | Bonaccio | G11C 11/1673 365/158 |
| 2016/0125951 A1* | 5/2016 | Sun | G11C 11/5642 365/185.24 |

\* cited by examiner

NONVOLATILE MEMORY DEVICE AND METHOD OF PROGRAMMING THE SAME

CROSS-REFERENCE TO RELATED APPLICATIONS

The present application claims priority under 35 U.S.C. 119(a) to Korean Patent Application No. 10-2015-0127678, filed on Sep. 9, 2015, which is herein incorporated by reference in its entirety.

BACKGROUND

1. Technical Field

Various embodiments of the present disclosure relate to a nonvolatile memory device and a method of programming the same and, more particularly, to nonvolatile memory devices having a uniform threshold voltage after program and methods of programming the same.

2. Related Art

Electrically erasable programmable read only memory (EEPROM) devices and flash memory devices are nonvolatile memory devices that retain their stored data even during power shut off. Various memory cell structures have been proposed to improve the performance of nonvolatile memory devices. A typical memory cell of a nonvolatile memory device may employ a stack gate structure including a floating gate, an inter-gate dielectric layer and a control gate which are sequentially stacked on a semiconductor substrate. As electronic systems become less with the development of fabrication techniques of semiconductor devices, system-on-chip (SOC) products have been revealed and utilized as important devices of high performance digital systems. SOC products may include a plurality of semiconductor devices executing various functions in a single chip. For example, an SOC product may include a logic device and a memory device integrated in a single chip. Thus, improved fabrication technologies may be required for embedding nonvolatile memory devices in SOC products.

Generally, to embed a nonvolatile memory device in an SOC product, the process technology of the nonvolatile memory device has to be compatible with the process technology of a logic device included in the SOC product. In general, logic devices may employ transistors having a single gate structure, whereas nonvolatile memory devices employ cell transistors having a stack gate structure (i.e., a double gate structure). Thus, SOC products including nonvolatile memory devices and logic devices may require a more complex process technology. Accordingly, single-layered gate nonvolatile memory devices employing a single-layered gate cell structure may be attractive as a candidate of the embedded nonvolatile memory devices. For example, complementary metal-oxide-semiconductor (CMOS) circuits of logic devices may be readily implemented using the process technology of a single-layered gate nonvolatile memory device. As a result, the process technology of single-layered gate nonvolatile memory devices may be widely used in the fabrication of SOC products including embedded nonvolatile memory devices.

SUMMARY

Various embodiments of the present disclosure are directed to nonvolatile memory devices having a uniform threshold voltage after program and methods of programming the same.

According to an embodiment, a nonvolatile memory device includes a memory cell and a switching unit. The memory cell includes a cell transistor having a floating gate and a coupling capacitor connected to the floating gate. The switching unit is coupled between the coupling capacitor and a bias terminal, and switches on or off based on the comparison result between a cell current flowing through the memory cell with a reference current during a program operation for programming the memory cell.

According to another embodiment, there is provided a method of programming a nonvolatile memory device. The method includes applying a program voltage to a memory cell to execute a program operation, and less controlling the applying of the program voltage to the memory cell based on a cell current flowing through the memory cell with a reference voltage.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
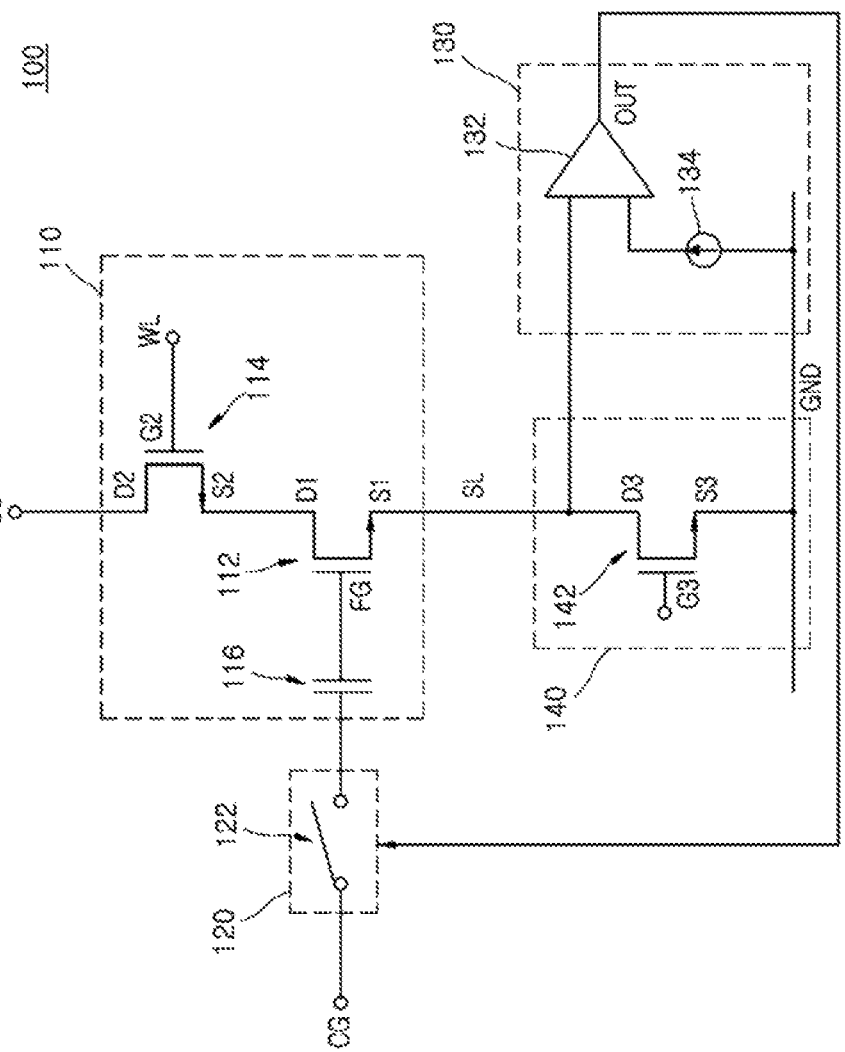
FIG. 1 is a circuit diagram illustrating a nonvolatile memory device, according to an embodiment of the present disclosure.

Nonvolatile memory devices may be fabricated in or on single wafers of semiconductor materials such as silicon wafers. The number of the nonvolatile memory devices that can be integrated in or on each wafer may differ according to the integration density of the nonvolatile memory devices. For example, several hundreds to several tens of thousands of nonvolatile memory devices may be integrated on each wafer. Generally, integrated nonvolatile memory devices may exhibit non-uniform characteristics due to variations in the fabrication process parameters depending upon their relative positions in or on a single wafer. For example, cell transistors of nonvolatile memory devices may exhibit non-uniform characteristics. In particular, the threshold voltages of the cell transistors in each nonvolatile memory device may be non-uniform after the cell transistors are programmed. If a deviation of the threshold voltages of the programmed cell transistors in each nonvolatile memory device is within an allowable range, the nonvolatile memory device may operate normally using various design schemes, for example, an appropriate program algorithm. However, if the deviation of the threshold voltages of the programmed cell transistors in each nonvolatile memory device is out of an allowable range, the nonvolatile memory device may malfunction. According to the following embodiments, a current flowing through each cell transistor may be compared with a reference value during a program operation and a coupling bias applied to the cell transistor may be controlled by the comparison result to provide uniform threshold voltages of all of the programmed cell transistors.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a circuit diagram illustrating a nonvolatile memory device 100, according to an embodiment of the present disclosure.

Referring to FIG. 1, the nonvolatile memory device 100 may be configured to include a memory cell 110, a switching unit 120, a comparing unit 130 and a ground connector 140. The memory cell 110 may include a cell transistor 112, a selection transistor 114 and a coupling capacitor 116. In some embodiments, each of the cell transistor 112 and the selection transistor 114 may be an N-channel metal-oxide-semiconductor field effect transistor (MOSFET). The cell transistor 112 may have a floating gate FG, and the selection transistor 114 may have a gate terminal G2. A drain terminal D1 of the cell transistor 112 may be connected to a source terminal S2 of the selection transistor 114. The gate terminal G2 and a drain terminal D2 of the selection transistor 114 may be connected to a word line WL and a bit line BL, respectively. A source terminal S1 of the cell transistor 112 may be connected to a source line SL. The floating gate FG of the cell transistor 112 may be connected to the coupling capacitor 116. In some embodiments, the coupling capacitor 116 may be a MOS capacitor.

The switching unit 120 may be coupled between the coupling capacitor 116 and a bias terminal CG. The switching unit 120 may include a switching element 122 that electrically connects the bias terminal CG to the coupling capacitor 116 or disconnects the bias terminal CG from the coupling capacitor 116. In some embodiments, the switching element 122 may be implemented using a MOSFET.

However, the MOSFET is merely an example of a suitable switching element 122. Any suitable switching element having three terminals may be employed as the switching element 122. While the switching element 122 may be switched on to electrically connect the coupling capacitor 116 to the bias terminal CG, a coupling voltage may be induced at the floating gate FG of the cell transistor 112 by a bias voltage applied to the bias terminal CG. The coupling voltage induced at the floating gate FG of the cell transistor 112 may be determined by a coupling ratio that is expressed as a function of a capacitance value of the coupling capacitor 116 and a capacitance value of the cell transistor 112. While the switching element 122 may be switched off to electrically disconnect the coupling capacitor 116 from the bias terminal CG, no coupling voltage may be induced at the floating gate FG of the cell transistor 112.

The comparing unit 130 may be configured to include a comparator 132 and a constant current source 134 generating a reference current. The comparator 132 may be implemented using a current comparator that has a first input terminal receiving a current flowing through the memory cell 110, a second input terminal receiving a reference current outputted from the constant current source 134, and an output terminal. The reference current generated from the constant current source 134 may be set to have a current value corresponding to any target threshold voltage selected from various threshold voltages that a plurality of memory cells (i.e., a plurality of cell transistors) including the memory cell 110 may obtain during a program operation. In some embodiments, the comparator 132 may generate an output signal OUT having a "high" logic level if a cell current flowing through the memory cell 110 is greater than the reference current, and the comparator 132 may generate the output signal OUT having a "low" logic level if the cell current flowing through the memory cell 110 is less than the reference current.

The switching element 122 may be switched on or off according to a logic level of the output signal OUT of the comparator 132. In some embodiments, if the cell current flowing through the memory cell 110 is greater than the reference current so that the output signal OUT of the comparator 132 has a "high" logic level, the switching element 122 may be switched on by the output signal OUT having a "high" logic level. Thus, if the cell current flowing through the memory cell 110 is greater than the reference current, a bias voltage applied to the bias terminal CG may be provided to the coupling capacitor 116. If the cell current flowing through the memory cell 110 is less than the reference current so that the output signal OUT of the comparator 132 has a "low" logic level, the switching element 122 may be switched off by the output signal OUT. Thus, if the cell current flowing through the memory cell 110 is less than the reference current, the bias voltage applied to the bias terminal CG may not be provided to the coupling capacitor 116.

The ground connector 140 may be coupled between the memory cell 110 and a ground terminal GND. The ground connector 140 may be implemented using an N-channel MOSFET 142. The N-channel MOSFET 142 may have a gate terminal G3, a drain terminal D3 and a source terminal S3. The gate terminal G3 may receive a gate control signal, and the N-channel MOSFET 142 may be turned on or off according to a level of the gate control signal. The N-channel MOSFET 142 may be turned off during a program operation and may be turned on during a read operation. The drain terminal D3 may be connected to the source terminal S1 of the cell transistor 112 through the source line SL. In addition, the drain terminal D3 may be connected to the first input terminal of the comparator 132. The source terminal S3 may be connected to the ground terminal GND. If the N-channel MOSFET 142 is turned on, the source terminal S1 of the cell transistor 112 may be connected to the ground terminal GND through the source line SL. Thus, the source terminal S1 of the cell transistor 112 may be grounded. That is, during the read operation, the N-channel MOSFET 142 may be turned on so that the source line SL is grounded. In contrast, if the N-channel MOSFET 142 is turned off, a current flowing through the source line SL may be supplied to the first input terminal of the comparator 132. That is, the cell current flowing through the cell transistor 112 may be supplied to the first input terminal of the comparator 132 if the N-channel MOSFET 142 is turned off. Accordingly, since the N-channel MOSFET 142 is turned off during the program operation, the comparator 132 may compare a cell current of the cell transistor 112 with the reference current to provide a uniform threshold voltage of the programmed cell transistor 112.

Figure 2:
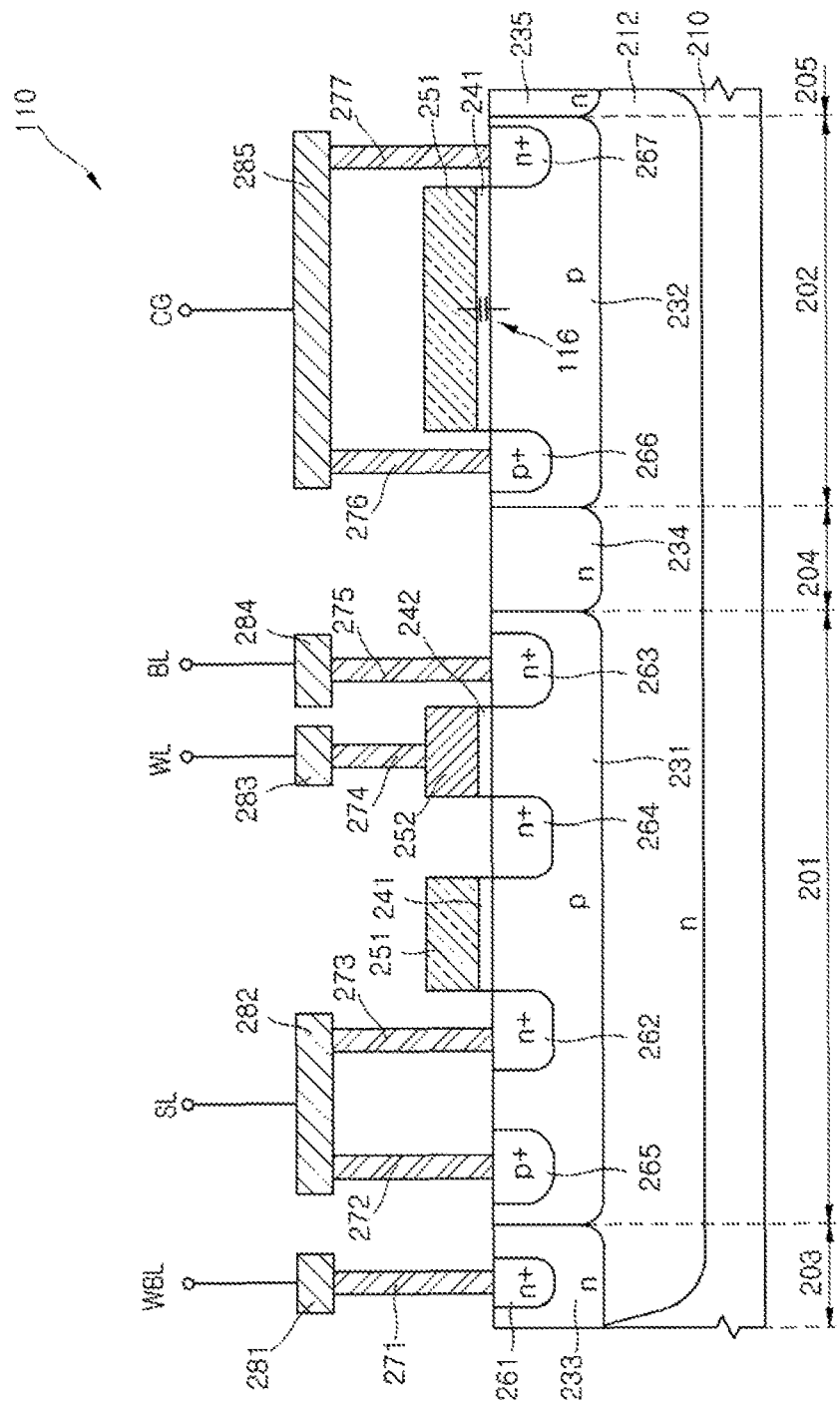
FIG. 2 is a cross-sectional view illustrating a memory cell of a nonvolatile memory device, according to an embodiment of the present disclosure.

FIG. 2 is a cross-sectional view illustrating a memory cell of a nonvolatile memory device, according to an embodiment of the present disclosure. For example, the memory cell of FIG. 2 may be the memory cell 110 of the nonvolatile memory device 100 shown in FIG. 1.

Referring to FIG. 2, the memory cell 110 may be a single-layered polysilicon gate memory cell. Specifically, an N-type deep well 212 may be disposed in an upper region of a substrate 210. The substrate 210 may have a P-type conductivity. The substrate 210 may have a memory cell region 201, a coupling region 202, and isolation regions 203, 204 and 205. The N-type deep well 212 may be disposed in the memory cell region 201, the coupling region 202, and the isolation regions 203, 204 and 205. The isolation regions 203 and 204 may be disposed at both sides of the memory cell region 201, respectively. The isolation regions 204 and 205 may be disposed at both sides of the coupling region 202, respectively. The isolation regions 203 and 204 may extend to surround sidewalls of the memory cell region 201, and the isolation regions 204 and 205 may extend to surround sidewalls of the coupling region 202. Thus, the isolation regions 203, 204 and 205 may be substantially connected to each other.

A first and a second P-type wells 231, 232 may be disposed in an upper region of the N-type deep well 212 to be spaced apart from each other. The first P-type well 231 may be disposed in the memory cell region 201, and the second P-type well 232 may be disposed in the coupling region 202. A first N-type well 233 may be disposed in an upper region of the N-type deep well 212 in the isolation region 203. A second N-type well 234 may be disposed in an upper region of the N-type deep well 212 in the isolation region 204. A third N-type well 235 may be disposed in an upper region of the N-type deep well 212 in the isolation region 205. The first and second N-type wells 233 and 234 may extend to surround sidewall of the first P-type well 231, and the second and third N-type wells 234 and 235 may extend to surround sidewall of the second P-type well 232. Thus, the first, second and third N-type wells 233, 234 and 235 may be substantially connected to each other.

A first gate insulation layer 241 and a floating gate 251 may be sequentially stacked on a portion of the first P-type well 231, and the first gate insulation layer 241 and the floating gate 251 may extend to cover a portion of the second P-type well 232. A second gate insulation layer 242 and a selection gate electrode 252 may be sequentially stacked on another portion of the first P-type well 231. A stack structure of the first gate insulation layer 241 and the floating gate 251 may be disposed to be spaced apart from a stack structure of the second gate insulation layer 242 and the selection gate electrode 252. In FIG. 2, the floating gate 251 on the first P-type well 231 is illustrated to be spaced apart from the floating gate 251 on the second P-type well 232. However, the floating gate 251 on the first P-type well 231 may extend to provide the floating gate 251 on the second P-type well 232, as described above. Thus, the floating gate 251 on the first P-type well 231 is substantially connected to the floating gate 251 on the second P-type well 232.

An N-type well contact region 261 may be disposed in an upper region of the first N-type well 233. An N-type source region 262, an N-type drain region 263 and an N-type floated junction region 264 may be spaced apart from each other along an upper region of the first P-type well 231. The N-type source region 262 and the N-type floated junction region 264 may be aligned with the two sidewalls of the floating gate 251, respectively. The N-type drain region 263 and the N-type floated junction region 264 may be aligned with the two sidewalls of the selection gate electrode 252, respectively. Thus, the N-type floated junction region 264 may be disposed in the first P-type well 231 under a space region between the floating gate 251 on the first P-type well 231 and the selection gate electrode 252. A first P-type well contact region 265 may be disposed in an upper region of the first P-type well 231 to be spaced apart from the N-type source region 262. A second P-type well contact region 266 and an N-type contact region 267 may be spaced apart from each other along an upper region of the second P-type well 23. The second P-type well contact region 266 and the N-type contact region 267 may be aligned with the two sidewalls of the floating gate 251 on the second P-type well 232, respectively.

The N-type well contact region 261 may be electrically connected to a first interconnection pattern 281 through a first contact plug 271. The first interconnection pattern 281 may be connected to a well bias line WBL. A bias applied to the well bias line WBL may have a voltage level that is appropriate for electrically isolating the first P-type well 231 from the second P-type well 232 and may be supplied to the N-type deep well 212 through the first N-type well 233, the second N-type well 234 and the third N-type well 235. The first P-type well contact region 265 and the N-type source region 262 may be electrically connected to a second interconnection pattern 282 through a second contact plug 272 and a third contact plug 273, respectively. The second interconnection pattern 282 may be connected to the source line SL. The selection gate electrode 252 may be electrically connected to a third interconnection pattern 283 through a fourth contact plug 274. The third interconnection pattern 283 may be connected to the word line WL. The N-type drain region 263 may be electrically connected to a fourth interconnection pattern 284 through a fifth contact plug 275. The fourth interconnection pattern 284 may be connected to the bit line BL. The second P-type well contact region 266 and the N-type contact region 267 may be connected to a fifth interconnection pattern 285 through a sixth contact plug 276 and a seventh contact plug 277, respectively. The fifth interconnection pattern 285 may be connected to the bias terminal CG. The second P-type well 232, the first gate insulation layer 241 stacked on the second P-type well 232, and the floating gate 251 stacked over the second P-type well 232 may constitute the coupling capacitor 116.

The first P-type well 231, the N-type source region 262, the N-type floated junction region 264, the first gate insulation layer 241 and the floating gate 251, which are disposed in the memory cell region 201, may constitute the cell transistor 112 of the memory cell 110 described with reference to FIG. 1. The first P-type well 231, the N-type drain region 263, the N-type floated junction region 264, the second gate insulation layer 242 and the selection gate electrode 252, which are disposed in the memory cell region 201, may constitute the selection transistor 114 of the memory cell 110 described with reference to FIG. 1. The N-type floated junction region 264 may act as a drain region of the cell transistor (112 of FIG. 1) and may also act as a source region of the selection transistor (114 of FIG. 1). The second P-type well 232, the first gate insulation layer 241 and the floating gate 251, which are disposed in the coupling region 202, may constitute the coupling capacitor 116 of the memory cell 110 described with reference to FIG. 1.

In order to execute a program operation of the memory cell 110, a gate turn-on voltage may be applied to the word line WL and a positive program voltage may be applied to the bias terminal CG. In addition, while the program operation is executed to program the memory cell 110, a positive bit line voltage may be applied to the bit line BL and a ground voltage may be applied to the source line SL connected to the first P-type well 231. The positive program voltage applied to the bias terminal CG may be provided to the second P-type well 232. In such a case, a coupling program voltage may be induced at the floating gate 251 by the positive program voltage applied to the second P-type well 232. The gate turn-on voltage applied to the word line WL may turn on the selection transistor (114 of FIG. 1). Thus, the cell transistor (112 of FIG. 2) connected to the selection transistor may be selected. As the selection transistor is turned on, a channel inversion layer may be formed between the N-type drain region 263 and the N-type floated junction region 264 and the positive bit line voltage applied to the bit line BL may be provided to the N-type floated junction region 264. Meanwhile, the coupling program voltage induced at the floating gate 251 may turn on the cell transistor. That is, a channel inversion layer may be formed between the N-type source region 262 and the N-type floated junction region 264. Thus, if the coupling program voltage is induced at the floating gate 251 and the first P-type well 231 is grounded, a voltage difference corresponding to the coupling program voltage may be created between the floating gate 251 and the channel inversion layer. Accordingly, electrons in the channel inversion layer may be injected into the floating gate 251 through the first gate insulation layer 241 by a Fowler-Nordheim (F-N) tunneling mechanism. As a result, the cell transistor may be programmed by the F-N tunneling mechanism. If the number of the hot electrons injected into the floating gate 251 increases during the program operation, the coupling program voltage induced at the floating gate 251 may be lowered to reduce a current flowing from the N-type drain region 263 toward the N-type source region 262 through the N-type floated junction region 264 (i.e., a current flowing from the bit line BL toward the source line SL).

Figure 3:
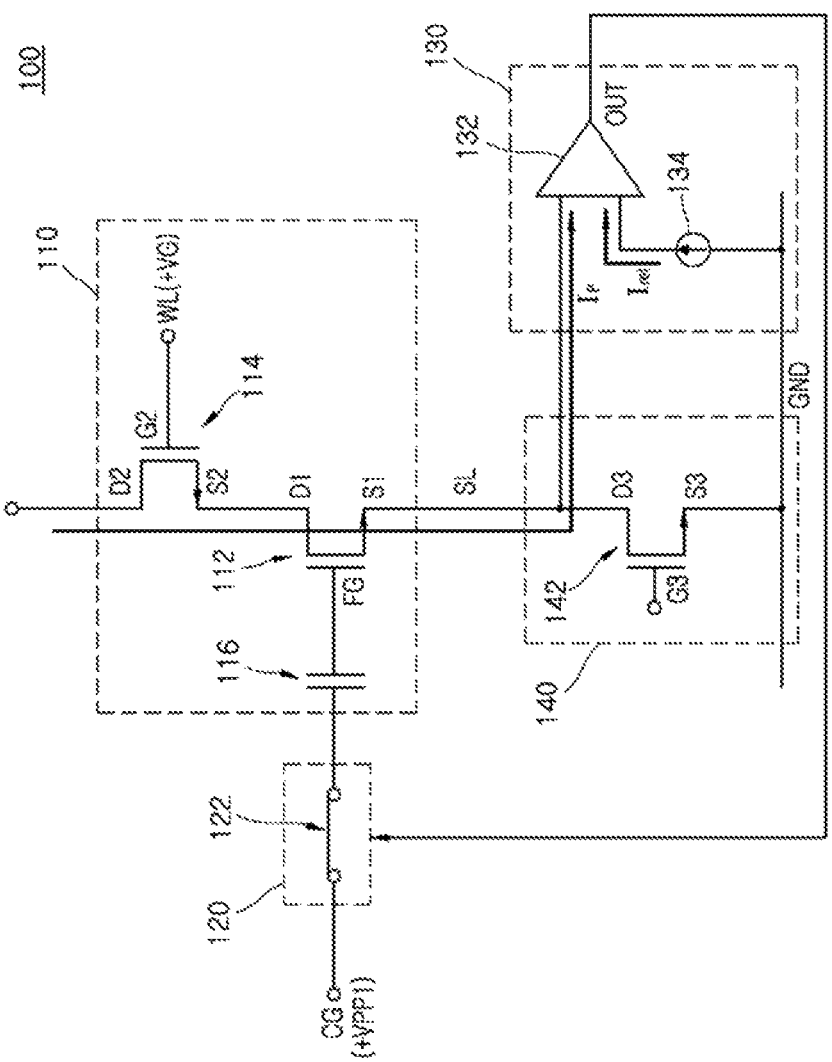
FIG. 3 is a circuit diagram illustrating a program operation of a nonvolatile memory device, according to an embodiment of the present disclosure.

FIG. 3 is a circuit diagram illustrating a program operation of a nonvolatile memory device, according to an embodiment of the present disclosure. For example, the nonvolatile memory device of FIG. 2 may be the nonvolatile memory device 100 shown in FIG. 1. In FIG. 3, the same reference numerals or designators as used in FIG. 1 denote the same elements. Accordingly, detailed descriptions of the same elements as described with reference to FIG. 1 will be omitted hereinafter to avoid unnecessary duplication.

Referring to FIG. 3, in order to execute a program operation of the cell transistor 112, a gate turn-on voltage +VG may be applied to the word line WL connected to the gate terminal G2 of the selection transistor 114 and a program bit line voltage +VBL1 may be applied to the bit line BL. Thus, the selection transistor 114 may be turned on to select the cell transistor 112. Moreover, a positive program voltage +VPP1 may be applied to the bias terminal CG while the switching element 122 is switched on to electrically connect the bias terminal CG to the coupling capacitor 116. Under the above bias condition, a coupling voltage generated by the coupling capacitor 116 may be induced at the floating gate FG of the cell transistor 112. The positive program voltage +VPP1 may have a sufficient voltage level to cause an F-N tunneling phenomenon in the cell transistor 112. In some embodiments, if a structure including the coupling capacitor 116 and the cell transistor 112 is designed to have a coupling ratio of about 90% or higher, the positive program voltage +VPP1 may be set to be about 16 volts. During programming the cell transistor 112 is executed, the N-channel MOSFET 142 of the ground connector 140 may be turned off.

During the program operation, a channel inversion layer may be formed between the drain terminal D1 and the source terminal S1 of the cell transistor 112, and a channel inversion layer may also be formed between the drain terminal D2 and the source terminal S2 of the selection transistor 114. Electrons in the channel inversion layer of the cell transistor 112 may be injected into the floating gate FG of the cell transistor 112 so that a threshold voltage of the cell transistor 112 increases to reach a target threshold voltage. While the electrons in the channel inversion layer are injected into the floating gate FG of the cell transistor 112, a cell current Ip may flow from the bit line BL into the first input terminal of the comparator 132 through the selection transistor 114 and the cell transistor 112. If the threshold voltage of the cell transistor 112 varies during the program operation, an amount of the cell current Ip may also vary. For example, if the number of the electrons injected into the floating gate FG of the cell transistor 112 increases during the program operation, the threshold voltage of the cell transistor 112 may increase to reduce the cell current Ip.

The comparator 132 may compare the cell current Ip flowing into the first input terminal with a reference current Iref flowing into the second input terminal from the constant current source 134. The reference current Iref may be set to a level corresponding to the target threshold voltage among the threshold voltages that a plurality of cell transistors including the cell transistor 112 may obtain after the program operation. If the cell current Ip is greater than the reference current Iref, the threshold voltage of the cell transistor 112 may be lower than the target threshold voltage. If the cell current Ip may be equal to the reference current Iref, the threshold voltage of the cell transistor 112 may be equal to the target threshold voltage. If the cell current Ip is less than the reference current Iref, the threshold voltage of the cell transistor 112 may be higher than the target threshold voltage.

The comparator 132 may generate the output signal OUT having a logic "high" level" while the cell current Ip is greater than the reference current Iref. In contrast, the comparator 132 may generate the output signal OUT having a "low" logic level" while the cell current Ip is less than the reference current Iref. The output signal OUT having a logic "high" level" may switch on the switching element 122 to electrically connect the bias terminal CG to the coupling capacitor 116. Thus, the coupling voltage may be continuously induced at the floating gate FG of the cell transistor 112 to still execute the program operation for programming the cell transistor 112. If the threshold voltage of the cell transistor 112 reaches the target threshold voltage, the output signal OUT may be generated to have a "low" logic level. In such a case, the switching element 122 may be switched off in response to the output signal OUT having a "low" logic level. Thus, the bias terminal CG may be electrically disconnected from the coupling capacitor 116. Accordingly, the coupling voltage may not be induced at the floating gate FG of the cell transistor 112 any more to terminate the program operation for programming the cell transistor 112. The logic levels of the output signal OUT may be set to be different according to the embodiments. For example, in some embodiments, the output signal OUT may be generated to have a "low" logic level while the cell current Ip is larger than the reference current Iref, and the output signal OUT may be generated to have a "high" logic level while the cell current Ip is less than the reference current Iref. In such a case, the switching element 122 may be switched on in response to the output signal OUT having a "low" logic level, and the switching element 122 may be switched off in response to the output signal OUT having a "high" logic level.

Figure 4:
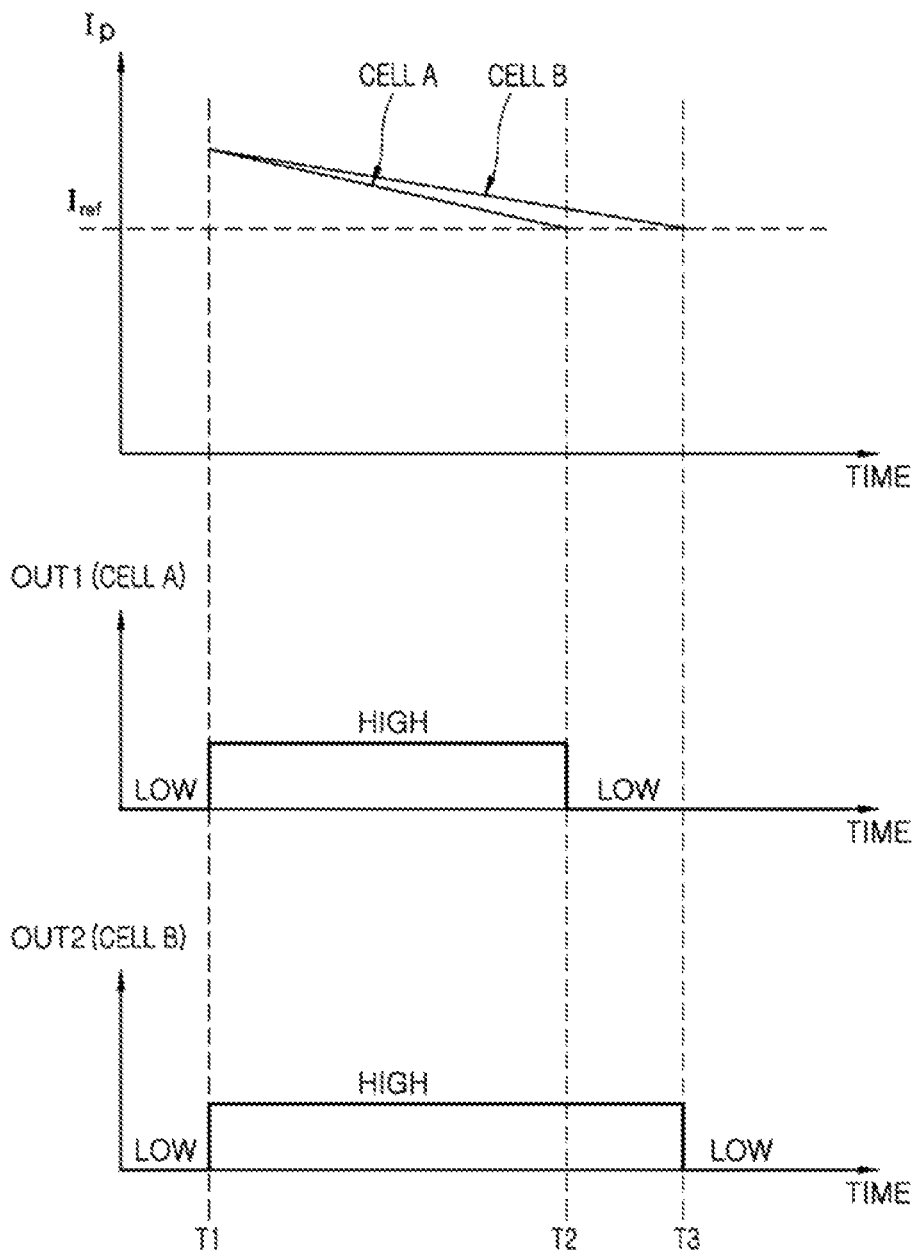
FIG. 4 are graphs comparing program characteristics of cell transistors included in a nonvolatile memory device, according to an embodiment of the present disclosure.

FIG. 4 illustrates graphs for comparing program characteristics of a plurality of cell transistors included in a nonvolatile memory device, according to an embodiment of the present disclosure. For example, the plurality of cell transistors of FIG. 4 may be included in the nonvolatile memory device 100 shown in FIG. 1.

In FIG. 4, each of a first cell transistor represented by a reference symbol "CELL A" and a second cell transistor represented by a reference symbol "CELL B" may have the same configuration and the same equivalent circuit as the memory cell 110 described with reference to FIGS. 1, 2 and 3. However, the first and second cell transistors "CELL A" and "CELL B" may exhibit different characteristics (e.g., different cell currents Ip) due to the non-uniformity of fabrication processes applied to a wafer, as illustrated in FIG. 4. For example, this difference between the cell currents Ip of the first and second cell transistors "CELL A" and "CELL B" may be due to a deviation of a thickness of the gate insulation layers, and/or a deviation of a doping concentration of the wells and the junction regions.

Referring to FIGS. 3 and 4, both of the first and second cell transistors "CELL A" and "CELL B" may be simultaneously programmed by selecting the first and second cell transistors "CELL A" and "CELL B" at a point of time "T1". In the program operation of the first and second cell transistors "CELL A" and "CELL B", a comparator 132 connected to the first cell transistor "CELL A" may generate an output signal OUT1 having a "high" logic level while the cell current Ip flowing through the first cell transistor "CELL A" is greater than the reference current Iref. Thus, the first cell transistor "CELL A" may be programmed while the cell current Ip flowing through the first cell transistor "CELL A" is greater than the reference current Iref. Similarly, a comparator 132 connected to the second cell transistor "CELL B" may generate an output signal OUT2 having a "high" logic level while the cell current Ip flowing through the second cell transistor "CELL B" is greater than the reference current Iref. Thus, the second cell transistor "CELL B" may be programmed while the cell current Ip flowing through the second cell transistor "CELL B" is greater than the reference current Iref.

As described above, the first and second cell transistors "CELL A" and "CELL B" may exhibit different characteristics. Thus, under the same bias condition for programming the first and second cell transistors "CELL A" and "CELL B", a point of time that a threshold voltage of the first cell transistor "CELL A" reaches the target threshold voltage may be different from a point of time that a threshold voltage of the second cell transistor "CELL B" reaches the target threshold voltage. Nevertheless, if the first and second cell transistors "CELL A" and "CELL B" are programmed for the same period, a difference between the threshold voltages of the programmed first and second cell transistors "CELL A" and "CELL B" may increases to cause a malfunction during a read operation for reading out data of the programmed first and second cell transistors "CELL A" and "CELL B".

According to the present embodiment, a logic level of the output signal OUT1 of the comparator 132 connected to the first cell transistor "CELL A" may be changed from a "high" logic level into a "low" logic level at a point of time "T2" that the cell current Ip of the first cell transistor "CELL A" becomes less than the reference current Iref, in order to resolve the above problem. As a result, the switching element 122 may be switched off to terminate the program operation of the first cell transistor "CELL A" at the point of time "T2". At the point of time "T2", the cell current Ip of the second cell transistor "CELL B" may still be greater than the reference current Iref. Thus, the output signal OUT2 of the comparator 132 connected to the second cell transistor "CELL B" may have a "high" logic level to continuously execute the program operation of the second cell transistor "CELL B". A logic level of the output signal OUT2 of the comparator 132 connected to the second cell transistor "CELL B" may be changed from a "high" logic level into a "low" logic level at a point of time "T3" that the cell current Ip of the second cell transistor "CELL B" becomes less than the reference current Iref. As a result, the switching element 122 may be switched off to terminate the program operation of the second cell transistor "CELL B" at the point of time "T3". Accordingly, even though the first and second cell transistors "CELL A" and "CELL B" have different characteristics due to the non-uniformity of the fabrication processes, the first and second cell transistors "CELL A" and "CELL B" may exhibit the same threshold voltage after the point of time "T3" that the above program operations terminate.

Figure 5:
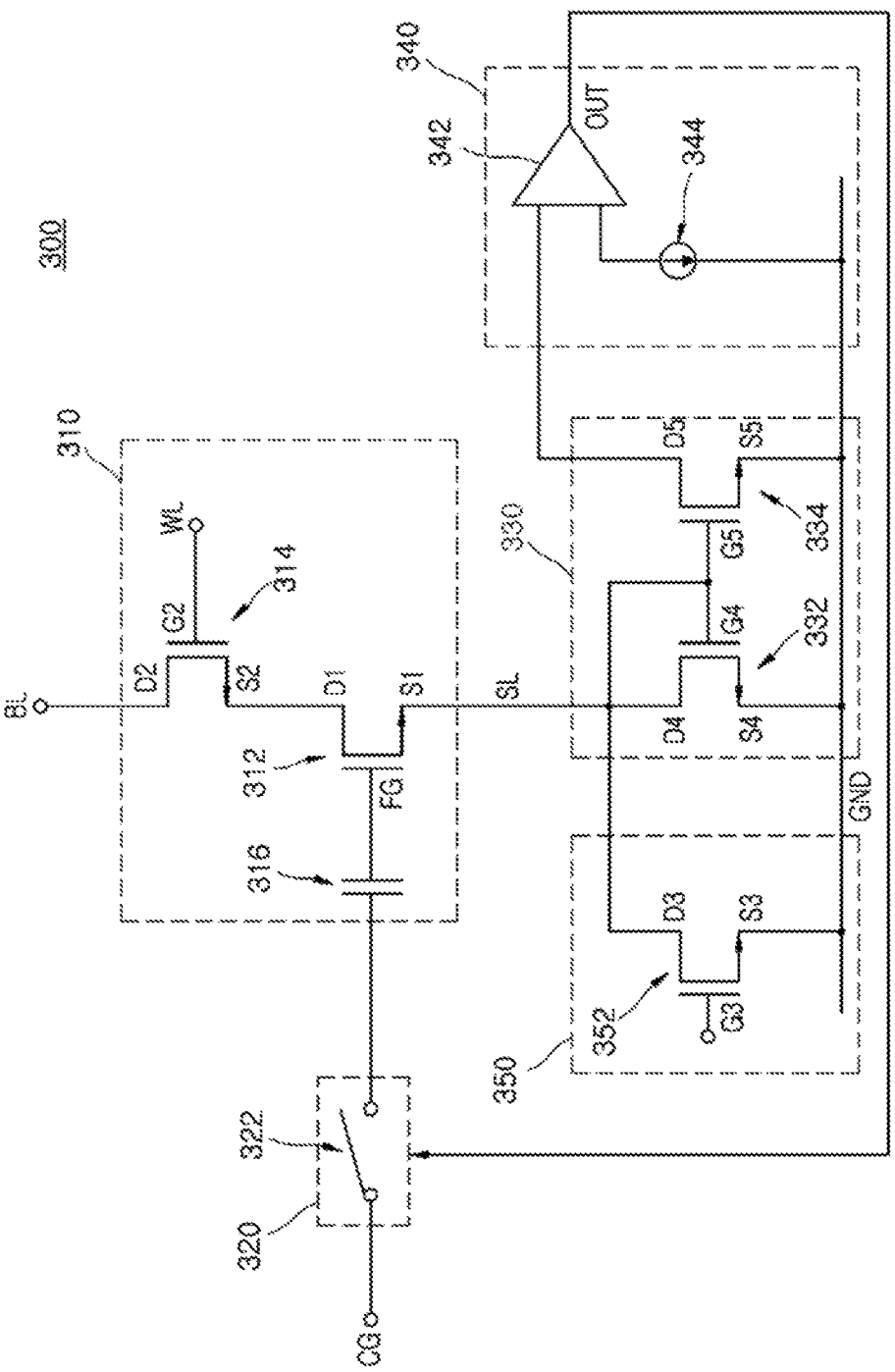
FIG. 5 is a circuit diagram illustrating a nonvolatile memory device, according to another embodiment of the present disclosure.

FIG. 5 is a circuit diagram illustrating a nonvolatile memory device 300 according to another embodiment of the present disclosure.

Referring to FIG. 5, the nonvolatile memory device 300 may be configured to include a memory cell 310, a switching unit 320, a current transfer unit 330, a comparing unit 340 and a ground connector 350. The memory cell 310 may include a cell transistor 312, a selection transistor 314 and a coupling capacitor 316. In some embodiments, each of the cell transistor 312 and the selection transistor 314 may be an N-channel MOSFET. The cell transistor 312 may have a floating gate FG, and the selection transistor 314 may have a gate terminal G2. A drain terminal D1 of the cell transistor 312 may be connected to a source terminal S2 of the selection transistor 314. The gate terminal G2 and a drain terminal D2 of the selection transistor 314 may be connected to a word line WL and a bit line BL, respectively. A source terminal S1 of the cell transistor 312 may be connected to a source line SL. The floating gate FG of the cell transistor 312 may be connected to the coupling capacitor 316. In some embodiments, the coupling capacitor 116 may be implemented to have a MOS capacitor structure. The memory cell 310 may be implemented to have the same cross-sectional structure as the memory cell 110 described with reference to FIG. 2.

The switching unit 320 may be coupled between the coupling capacitor 316 and a bias terminal CG. The switching unit 320 may include a switching element 322 that electrically connects the bias terminal CG to the coupling capacitor 316 or disconnects the bias terminal CG from the coupling capacitor 316. In some embodiments, the switching element 322 may be implemented using a MOSFET. However, the MOSFET is merely an example of a suitable switching element 322. That is, any switching element having three terminals may be employed as the switching element 322. While the switching element 322 is switched on to electrically connect the coupling capacitor 316 to the bias terminal CG, a coupling voltage may be induced at the floating gate FG of the cell transistor 312 by a bias voltage applied to the bias terminal CG. The coupling voltage induced at the floating gate FG of the cell transistor 312 may be determined by a coupling ratio that is expressed as a function of a capacitance value of the coupling capacitor 316 and a capacitance value of the cell transistor 312. While the switching element 322 is switched off to electrically disconnect the coupling capacitor 316 from the bias terminal CG, no coupling voltage may be induced at the floating gate FG of the cell transistor 312.

The current transfer unit 330 may transfer a current flowing through the memory cell 310 to the comparing unit 340. The current transfer unit 330 may be implemented using a current mirror circuit that is configured to include a first MOSFET 332 and a second MOSFET 334. The current mirror circuit may have an advantage that a stable output current is generated regardless of a load on the current mirror circuit. A gate terminal G4 of the first MOSFET 332 may be connected to a gate terminal G5 of the second MOSFET 334. A source terminal S4 of the first MOSFET 332 and a source terminal S5 of the second MOSFET 334 may be connected to a ground terminal GND in common. A drain terminal D4 of the first MOSFET 332 may be connected to the source terminal S1 of the cell transistor 312 and the gate terminal G4 of the first MOSFET 332. A drain terminal D5 of the second MOSFET 334 may be connected to the comparing unit 340. A current (Ipb of FIG. 6) flowing from the drain terminal D5 of the second MOSFET 334 toward the source terminal S5 of the second MOSFET 334 may be equal to an amount of a cell current (Ipa of FIG. 6) flowing from the drain terminal D4 of the first MOSFET 332 toward the source terminal S4 of the first MOSFET 332.

Figure 6:
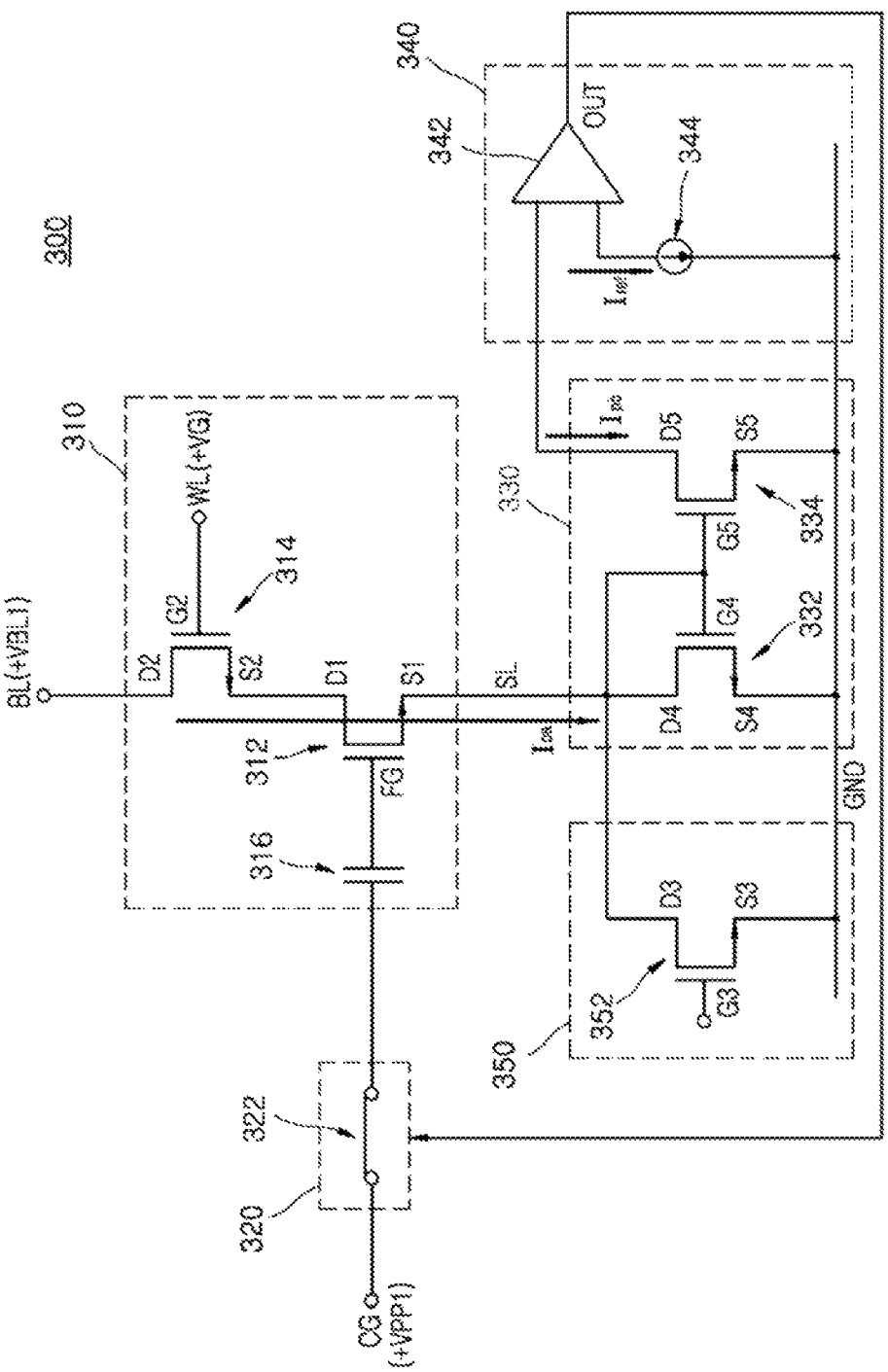
FIG. 6 is a circuit diagram illustrating a program operation of a nonvolatile memory device, according to another embodiment of the present disclosure.

The comparing unit 340 may be configured to include a comparator 342 and a constant current source 344 generating a reference current (Iref of FIG. 6). The comparator 342 may be implemented using a current comparator that has a first input terminal, a second input terminal, and an output terminal. The first input terminal of the comparator 342 may be connected to the drain terminal D5 of the second MOSFET 334 of the current transfer unit 330. The second input terminal of the comparator 342 may be connected to the constant current source 344 generating the reference current Iref. An output terminal of the comparator 342 may be connected to the switching unit 320. The reference current Iref generated from the constant current source 344 may be set to have a current value corresponding to any one (i.e., a target threshold voltage) selected from various threshold voltages that a plurality of memory cells including the memory cell 310 (i.e., a plurality of cell transistors including the cell transistor 312) may obtain after the program operation. In some embodiments, the comparator 342 may generate an output signal OUT having a "high" logic level if a cell current Ipa (i.e., Ipb) flowing through the memory cell 310 is greater than the reference current Iref, and the comparator 342 may generate the output signal OUT having a "low" logic level if the cell current Ipa (i.e., Ipb) flowing through the memory cell 310 is less than the reference current Iref.

The switching element 322 of the switching unit 320 may be switched on or off according to a logic level of the output signal OUT of the comparator 342. In some embodiments, if the cell current Ipa (i.e., Ipb) flowing through the memory cell 310 is greater than the reference current, the output signal OUT of the comparator 342 may be generated to have a "high" logic level and the switching element 322 may be switched on in response to the output signal OUT having a logic "high" level. Thus, while the cell current Ipa (i.e., Ipb) flowing through the memory cell 310 is greater than the reference current Iref, the bias voltage applied to the bias terminal CG may be provided to the coupling capacitor 316. In contrast, if the cell current Ipa (i.e., Ipb) flowing through the memory cell 310 is less than the reference current Iref, the output signal OUT of the comparator 342 may be generated to have a "low" logic level and the switching element 322 may be switched off in response to the output signal OUT having a "low" logic level. Thus, while the cell current Ipa (i.e., Ipb) flowing through the memory cell 310 is less than the reference current Iref, the bias voltage applied to the bias terminal CG may not be provided to the coupling capacitor 316.

The ground connector 350 may be coupled between the memory cell 310 and the ground terminal GND. The ground connector 350 may be implemented using an N-channel MOSFET 352. The N-channel MOSFET 352 may have a gate terminal G3, a drain terminal D3 and a source terminal S3. The gate terminal G3 of the N-channel MOSFET 352 may receive a gate control signal, and the N-channel MOSFET 352 may be turned on or off according to a level of the gate control signal. The drain terminal D3 of the N-channel MOSFET 352 may be connected to the source terminal S1 of the cell transistor 312 through the source line SL. The source terminal S3 of the N-channel MOSFET 352 may be connected to the ground terminal GND. If the N-channel MOSFET 352 may be turned on, the source line SL connected to the source terminal S1 of the cell transistor 312 may be grounded. Thus, the source terminal S1 of the cell transistor 312 may also be grounded. During a read operation, the N-channel MOSFET 352 may be turned on to ground the source line SL. In contrast, the N-channel MOSFET 352 may be turned off during the program operation. In such a case, the cell current (Ipa in FIG. 6) flowing through the source line SL may cause the current (Ipb in FIG. 6) flowing through the second MOSFET 334 of the current transfer unit 330, and the comparator 342 may compare the current Ipb with the reference current Iref to generate the output signal OUT. Accordingly, the N-channel MOSFET 352 may be turned off during the program operation to obtain a uniform threshold voltage of the cell transistor 312 after the program operation.

FIG. 6 is a circuit diagram illustrating a program operation of a nonvolatile memory device according to another embodiment of the present disclosure. For example, the nonvolatile memory device of FIG. 6 may be the nonvolatile memory device 300 shown in FIG. 5. In FIG. 6, the same reference numerals or the same reference designators as used in FIG. 5 denote the same elements. Accordingly, detailed descriptions of the same elements as described with reference to FIG. 5 will be omitted hereinafter to avoid unnecessary duplication.

Referring to FIG. 6, in order to execute the program operation of the cell transistor 312, a gate turn-on voltage +VG may be applied to the word line WL connected to the gate terminal G2 of the selection transistor 314 and a program bit line voltage +VBL1 may be applied to the bit line BL. Thus, the selection transistor 314 may be turned on to select the cell transistor 312. Moreover, a positive program voltage +VPP1 may be applied to the bias terminal CG while the switching element 322 is switched on to electrically connect the bias terminal CG to the coupling capacitor 316. Under the above bias condition, a coupling voltage generated by the coupling capacitor 316 may be induced at the floating gate FG of the cell transistor 312. The positive program voltage +VPP1 may have a sufficient voltage level to cause an F-N tunneling phenomenon in the cell transistor 312. In some embodiments, if a structure including the coupling capacitor 316 and the cell transistor 312 is designed to have a coupling ratio of about 90% or higher, the positive program voltage +VPP1 may be set to be about 16 volts. During programming the cell transistor 312 is executed, the N-channel MOSFET 352 of the ground connector 350 may be turned off.

During a program operation, a channel inversion layer may be formed between the drain terminal D1 and the source terminal S1 of the cell transistor 312, and a channel inversion layer may also be formed between the drain terminal D2 and the source terminal S2 of the selection transistor 314. Electrons in the channel inversion layer of the cell transistor 312 may be injected into the floating gate FG of the cell transistor 312 so that a threshold voltage of the cell transistor 312 increases to reach a target threshold voltage. While the electrons in the channel inversion layer are injected into the floating gate FG of the cell transistor 312, the cell current Ipa may flow from the bit line BL into the source line SL through the selection transistor 314 and the cell transistor 312. If the cell current Ipa flows from the bit line BL into the source line SL, a current Ipb equal to the cell current Ipa may flow through the second MOSFET 334 of a current mirror circuit constituting the current transfer unit 330. If the threshold voltage of the cell transistor 312 varies during the program operation, the cell current Ipa, and therefore the current Ipb may also vary. For example, if the number of the electrons injected into the floating gate FG of the cell transistor 312 increases during the program operation, the threshold voltage of the cell transistor 312 may increase to reduce the cell current Ipa (I.e., the current Ipb).

The comparator 342 may compare the current Ipb flowing through the source line SL connected to the first input terminal with the reference current Iref generated from the constant current source 334 connected to the second input terminal. The reference current Iref may be set to a level corresponding to the target threshold voltage among the threshold voltages that the plurality of cell transistors including the cell transistor 312 can obtain after the program operation. If the cell current Ipa (i.e., Ipb) is greater than the reference current Iref, the threshold voltage of the cell transistor 312 may be lower than the target threshold voltage. If the cell current Ipa (i.e., Ipb) may be equal to the reference current Iref, the threshold voltage of the cell transistor 312 may be may be equal to the target threshold voltage. If the cell current Ipa (i.e., Ipb) is less than the reference current Iref, the threshold voltage of the cell transistor 312 may be may be higher than the target threshold voltage.

The comparator 342 may generate the output signal OUT having a "high" logic level" while the cell current Ipa (i.e., Ipb) is greater than the reference current Iref. In contrast, the comparator 342 may generate the output signal OUT having a "low" logic level" while the cell current Ipa (i.e., Ipb) is less than the reference current Iref. The output signal OUT having a "high" logic level may switch on the switching element 322 to electrically connect the bias terminal CG to the coupling capacitor 316. Thus, the coupling voltage may be continuously induced at the floating gate FG of the cell transistor 312 to still execute the program operation for programming the cell transistor 312. If the threshold voltage of the cell transistor 312 reaches the target threshold voltage, a level of the output signal OUT may be changed from a "high" logic level into a "low" logic level. In such a case, the switching element 322 may be switched off in response to the output signal OUT having a "low" logic level. Thus, the bias terminal CG may be electrically disconnected from the coupling capacitor 316. Accordingly, the coupling voltage may not be induced at the floating gate FG of the cell transistor 312 any more to terminate the program operation for programming the cell transistor 312. The logic levels of the output signal OUT may be set to be different according to different embodiments. For example, in some embodiments, the output signal OUT may be generated to have a "low" logic level while the cell current Ipa is larger than the reference current Iref, and the output signal OUT may be generated to have a "high" logic level while the cell current Ipa is less than the reference current Iref. In such a case, the switching element 322 may be switched on in response to the output signal OUT having a "low" logic level, and the switching element 322 may be switched off in response to the output signal OUT having a logic "high" level.

Figure 7:
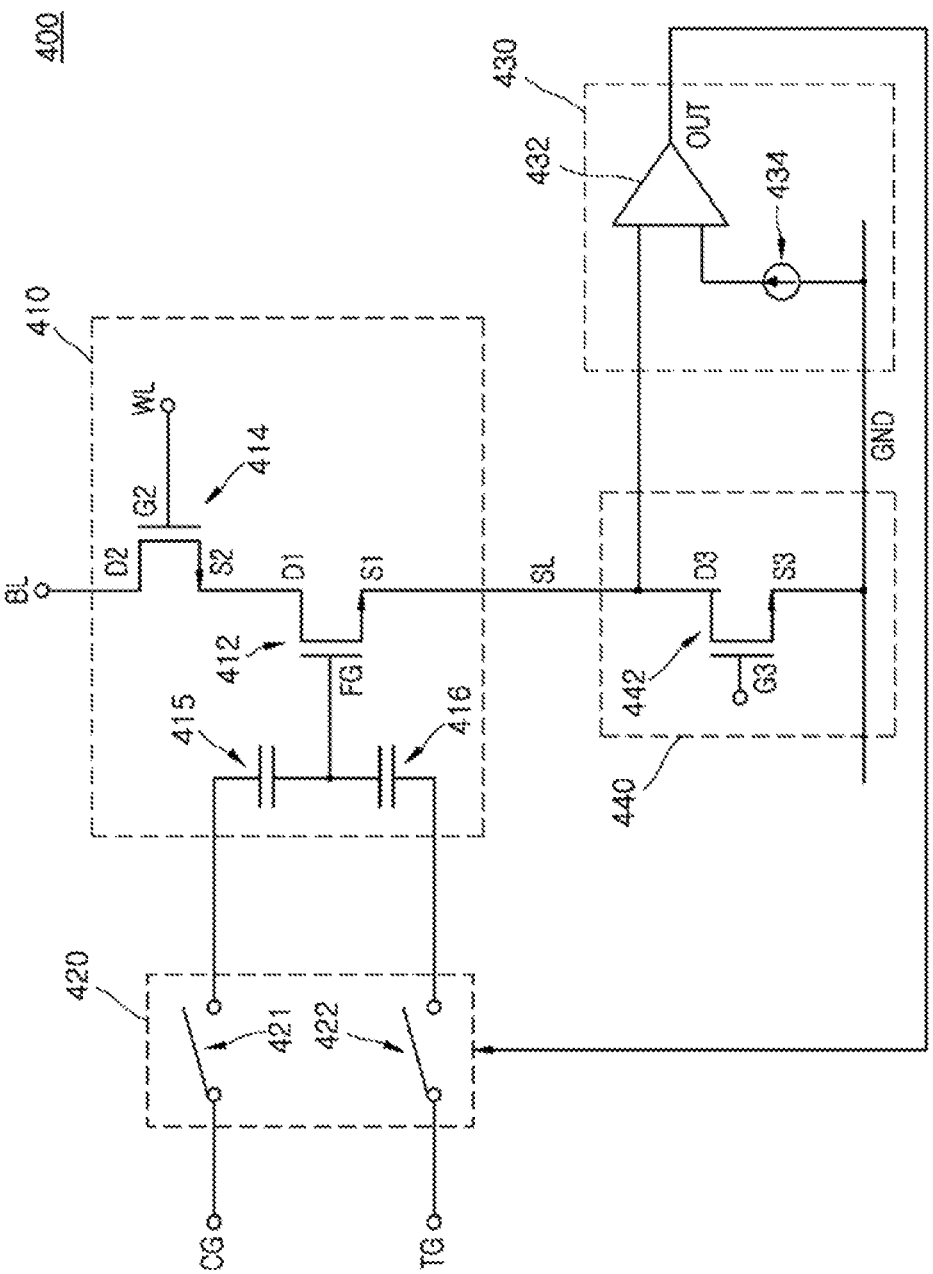
FIG. 7 is a circuit diagram illustrating a nonvolatile memory device, according to yet another embodiment of the present disclosure.

FIG. 7 is a circuit diagram illustrating a nonvolatile memory device 400 according to yet another embodiment of the present disclosure.

Referring to FIG. 7, the nonvolatile memory device 400 may be configured to include a memory cell 410, a switching unit 420, a comparing unit 430 and a ground connector 440. The memory cell 410 may include a cell transistor 412, a selection transistor 414, a coupling capacitor 415 and a tunneling capacitor 416. In some embodiments, each of the cell transistor 412 and the selection transistor 414 may be an N-channel MOSFET. The cell transistor 412 may have a floating gate FG, and the selection transistor 414 may have a gate terminal G2. A drain terminal D1 of the cell transistor 412 may be connected to a source terminal S2 of the selection transistor 414. The gate terminal G2 and the drain terminal D2 of the selection transistor 414 may be connected to a word line WL and a bit line BL, respectively. The source terminal S1 of the cell transistor 412 may be connected to a source line SL. The floating gate FG of the cell transistor 412 may be connected to common node between the coupling capacitor 415 and the tunneling capacitor 416. The coupling capacitor 415 and the tunneling capacitor 416 may be connected in parallel to the floating gate FG of the cell transistor 412. In some embodiments, each of the coupling capacitor 415 and the tunneling capacitor 416 may be implemented to have a MOS capacitor structure.

The switching unit 420 may be coupled between the memory cell 410 and a first bias terminal CG as well as between the memory cell 410 and a second bias terminal TG. The switching unit 420 may include a first switching element 421 and a second switching element 422. The first switching element 421 may be coupled between the first bias terminal CG and the coupling capacitor 415 to electrically connect the first bias terminal CG to the coupling capacitor 415 or to electrically disconnect the first bias terminal CG from the coupling capacitor 415. The second switching element 422 may be coupled between the second bias terminal TG and the tunneling capacitor 416 to electrically connect the second bias terminal TG to the tunneling capacitor 416 or to electrically disconnect the second bias terminal TG from the tunneling capacitor 416. In some embodiments, each of the first and second switching elements 421 and 422 may be a MOSFET. However, the MOSFET is merely an example of suitable first and second switching elements 421 and 422. That is, any suitable switching elements having three terminals may be employed as the first and second switching elements 421 and 422. While the first switching element 421 is switched on to electrically connect the coupling capacitor 415 to the first bias terminal CG, a coupling voltage may be induced at the floating gate FG of the cell transistor 412 by a bias voltage applied to the first bias terminal CG. While the second switching element 422 is switched on to electrically connect the tunneling capacitor 416 to the second bias terminal TG, a coupling voltage may be induced at the floating gate FG of the cell transistor 412 by a bias voltage applied to the second bias terminal TG. The coupling voltage induced at the floating gate FG of the cell transistor 412 may be determined by a coupling ratio that is expressed as a function of a capacitance value of the coupling capacitor 415, a capacitance value of the tunneling capacitor 416 and a capacitance value of the cell transistor 412. While the first and second switching elements 421 and 422 are switched off to electrically disconnect the coupling capacitor 415 and the tunneling capacitor 416 from the first and second bias terminals CG and TG, respectively, no coupling voltage may be induced at the floating gate FG of the cell transistor 412. During a program operation, both of the first and second switching elements 421 and 422 may be switched on or off.

The comparing unit 430 may be configured to include a comparator 432 and a constant current source 434 generating a reference current. The comparator 432 may be implemented using a current comparator that has a first input terminal receiving a current flowing through the memory cell 410, a second input terminal receiving a reference current from the constant current source 434, and an output terminal. The reference current generated from the constant current source 434 may be set to have a current value corresponding to a target threshold voltage selected from various threshold voltages that a plurality of memory cells including the memory cell 410 (i.e., a plurality of cell transistors including the cell transistor 412) can obtain after a program operation. In some embodiments, the comparator 432 may generate an output signal OUT having a "high" logic level if a cell current flowing through the memory cell 410 is greater than the reference current, and the comparator 432 may generate the output signal OUT having a "low" logic level if the cell current flowing through the memory cell 410 is less than the reference current.

The first and second switching elements 421 and 422 may be switched on or off according to a logic level of the output signal OUT of the comparator 432. In some embodiments, if the cell current flowing through the memory cell 410 is greater than the reference current, the output signal OUT of the comparator 432 may be generated to have a "high" logic level and the first and second switching elements 421 and 422 may be switched on in response to the output signal OUT having a logic "high" level. Thus, while the cell current flowing through the memory cell 410 is greater than the reference current, a first bias voltage applied to the first bias terminal CG may be provided to the coupling capacitor 415 and a second bias voltage applied to the second bias terminal TG may be provided to the tunneling capacitor 416. In contrast, if the cell current flowing through the memory cell 410 is less than the reference current, the output signal OUT of the comparator 132 may be generated to have a "low" logic level and the first and second switching elements 421 and 422 may be switched off in response to the output signal OUT having a "low" logic level. Thus, while the cell current flowing through the memory cell 410 is less than the reference current, no bias voltage may be provided to the coupling capacitor 415 and the tunneling capacitor 416.

The ground connector 440 may be coupled between the memory cell 410 and a ground terminal GND. The ground connector 440 may be implemented using an N-channel MOSFET 442. The N-channel MOSFET 442 may have a gate terminal G3, a drain terminal D3 and a source terminal S3. The gate terminal G3 of the N-channel MOSFET 442 may receive a gate control signal, and the N-channel MOSFET 442 may be turned on or off according to a level of the gate control signal. For example, the N-channel MOSFET 442 may be turned off during the program operation and may be turned on during a read program operation. The drain terminal D3 of the N-channel MOSFET 442 may be connected to the source terminal S1 of the cell transistor 412 through the source line SL. In addition, the drain terminal D3 of the N-channel MOSFET 442 may be connected to the first input terminal of the comparator 432. The source terminal S3 of the N-channel MOSFET 442 may be connected to the ground terminal GND. If the N-channel MOSFET 442 is turned on, the source terminal S1 of the cell transistor 412 may be connected to the ground terminal GND through the source line SL. Thus, the source terminal S1 of the cell transistor 412 may be grounded. That is, during a read operation, the N-channel MOSFET 442 may be turned on so that the source line SL is grounded. In contrast, if the N-channel MOSFET 442 is turned off, a current flowing through the source line SL may be supplied to the first input terminal of the comparator 432. That is, the cell current flowing through the cell transistor 412 may be supplied to the first input terminal of the comparator 432 if the N-channel MOSFET 442 is turned off. Accordingly, since the N-channel MOSFET 442 is turned off during the program operation, the comparator 432 may compare a cell current of the cell transistor 412 with the reference current to provide a uniform threshold voltage of the programmed cell transistor 412.

Figure 8:
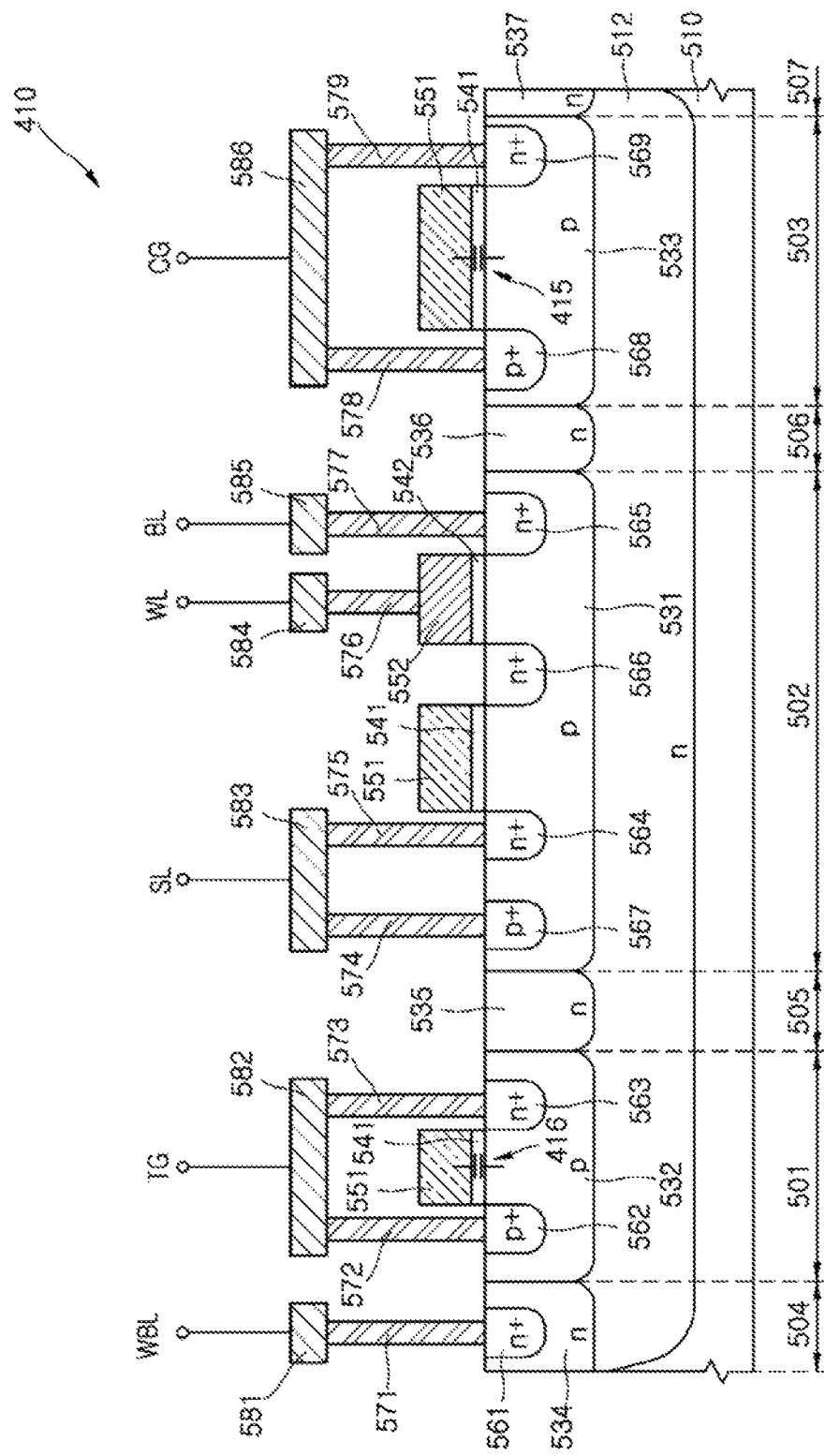
FIG. 8 is a cross-sectional view illustrating a memory cell of a nonvolatile memory device, according to yet another embodiment of the present disclosure.

FIG. 8 is a cross-sectional view illustrating a memory cell of a nonvolatile memory device according to yet another embodiment of the present disclosure. For example, the memory cell of FIG. 8 may be the memory cell 410 of the nonvolatile memory device 400 shown in FIG. 7.

Referring to FIG. 8, the memory cell 410 may be a single-layered polysilicon gate memory cell. Specifically, an N-type deep well 512 may be disposed in an upper region of a substrate 510. The substrate 510 may have a P-type conductivity. The substrate 510 may have a tunneling region 501, a memory cell region 502, a coupling region 503, and isolation regions 504, 505, 506 and 507. The N-type deep well 512 may be disposed in the tunneling region 501, the memory cell region 502, the coupling region 503, and the isolation regions 504, 505, 506 and 507. The isolation regions 504 and 505 may be disposed at both sides of the tunneling region 501, respectively. The isolation regions 505 and 506 may be disposed at both sides of the memory cell region 502, respectively. The Isolation regions 506 and 507 may be disposed at both sides of the coupling region 503, respectively. The isolation regions 504 and 505 may extend to surround sidewalls of the tunneling region 501, and the isolation regions 505 and 506 may extend to surround sidewalls of the memory cell region 502. In addition, the isolation regions 506 and 507 may extend to surround sidewalls of the coupling region 503. Thus, the isolation regions 504, 505, 506 and 507 may be substantially connected to each other.

A first P-type well 531, a second P-type well 532 and a third P-type well 533 may be spaced apart from each other along an upper region of the N-type deep well 512. The first and second P-type wells 531, 532 may be disposed in the memory cell region 502 and the tunneling region 501, respectively. In addition, the third P-type well 533 may be disposed in the coupling region 503. A first N-type well 534 may be disposed in an upper region of the N-type deep well 512 in the isolation region 504. A second N-type well 535 may be disposed in an upper region of the N-type deep well 512 in the isolation region 505. A third N-type well 536 may be disposed in an upper region of the N-type deep well 512 in the isolation region 506. A fourth N-type well 537 may be disposed in an upper region of the N-type deep well 512 in the isolation region 507. The first and second N-type wells 534 and 535 may extend to surround sidewalls of the second P-type well 532. The second and third N-type wells 535 and 536 may extend to surround sidewalls of the first P-type well 531. The third and fourth N-type wells 536 and 537 may extend to surround sidewalls of the third P-type well 533. Thus, the first to fourth N-type wells 534, 535, 536 and 537 may be substantially connected to each other.

A first gate insulation layer 541 and a floating gate 551 may be sequentially stacked on a portion of the first P-type well 531. The first gate insulation layer 541 and the floating gate 551 may extend to cover a portion of the second P-type well 532 and a portion of the third P-type well 533. A second gate insulation layer 542 and a selection gate electrode 552 may be sequentially stacked on another portion of the first P-type well 531. A stack structure of the first gate insulation layer 541 and the floating gate 551 may be disposed to be spaced apart from a stack structure of the second gate insulation layer 542 and the selection gate electrode 552. In FIG. 8, the floating gate 551 on the first P-type well 531 is illustrated to be spaced apart from the floating gate 551 on the second P-type well 532, and the floating gate 551 on the third P-type well 533 is illustrated to be spaced apart from the floating gate 551 on the second P-type well 532. However, the floating gate 551 on the first P-type well 531 may extend to provide the floating gate 551 on the second P-type well 532 and the floating gate 551 on the third P-type well 533, as described above. Thus, the floating gates 551 on the first, second and third P-type wells 531, 532 and 533 may be substantially connected to each other.

An N-type well contact region 561 may be disposed in an upper region of the first N-type well 534. A first P-type well contact region 562 and a first N-type contact region 563 may be spaced apart from each other along an upper region of the second P-type well 532. The first P-type well contact region 562 and the first N-type contact region 563 may be aligned with both sidewalls of the floating gate 551 on the second P-type well 532, respectively. An N-type source region 564, an N-type drain region 565 and an N-type floated junction region 566 may be disposed in an upper region of the first P-type well 531 to be spaced apart from each other. The N-type source region 564 and the N-type floated junction region 566 may be aligned with both sidewalls of the floating gate 551 on the first P-type well 531, respectively. The N-type drain region 565 and the N-type floated Junction region 566 may be aligned with both sidewalls of the selection gate electrode 552, respectively. Thus, the N-type floated junction region 566 may be disposed in the first P-type well 531 under a space region between the floating gate 551 on the first P-type well 531 and the selection gate electrode 552. A second P-type well contact region 567 may be disposed in an upper region of the first P-type well 531 to be spaced apart from the N-type source region 564. A third P-type well contact region 568 and a second N-type contact region 569 may be disposed in an upper region of the third P-type well 533 to be spaced apart from each other. The third P-type well contact region 568 and the second N-type contact region 569 may be aligned with both sidewalls of the floating gate 551 on the third P-type well 533, respectively.

The N-type well contact region 561 may be electrically connected to a first interconnection pattern 581 through a first contact plug 571. The first interconnection pattern 581 may be connected to a well bias line WBL. A bias applied to the well bias line WBL may have a voltage level that is appropriate for electrically isolating the first, second and third P-type wells 531, 532 and 533 from each other. A bias applied to the well bias line WBL may be supplied to the N-type deep well 512 through the first to fourth N-type wells 534, 535, 536 and 537. The first P-type well contact region 562 and the first N-type contact region 563 may be electrically connected to a second interconnection pattern 582 through second and third contact plugs 572, 573, respectively. The second interconnection pattern 582 may be connected to the second bias terminal TG. The second P-type well contact region 567 and the N-type source region 564 may be electrically connected to a third interconnection pattern 583 through fourth and fifth contact plugs 574, 575, respectively. The third interconnection pattern 583 may be connected to the source line SL. The selection gate electrode 552 may be electrically connected to a fourth interconnection pattern 584 through a sixth contact plug 576. The fourth interconnection pattern 584 may be connected to the word line WL. The N-type drain region 565 may be electrically connected to a fifth interconnection pattern 585 through a seventh contact plug 577. The fifth interconnection pattern 585 may be connected to the bit line BL. The third P-type well contact region 568 and the second N-type contact region 569 may be connected to a sixth interconnection pattern 586 through eighth and ninth contact plugs 578, 579, respectively. The sixth interconnection pattern 586 may be connected to the first bias terminal CG. The third P-type well 533, the first gate insulation layer 541 stacked on the third P-type well 533, and the floating gate 551 stacked over the third P-type well 533 may constitute the coupling capacitor 415. The second P-type well 532, the first gate insulation layer 541 stacked on the second P-type well 532, and the floating gate 551 stacked over the second P-type well 532 may constitute the tunneling capacitor 416.

The first P-type well 531, the N-type source region 564, the N-type floated junction region 566, the first gate insulation layer 541 and the floating gate 551, which are disposed in the memory cell region 502, may constitute the cell transistor 412 of the memory cell 410 described with reference to FIG. 7. The first P-type well 531, the N-type drain region 565, the N-type floated junction region 566, the second gate insulation layer 542 and the selection gate electrode 552, which are disposed in the memory cell region 502, may constitute the selection transistor 414 of the memory cell 410 described with reference to FIG. 7. The N-type floated junction region 566 may act as a drain region of the cell transistor (412 of FIG. 7) and may also act as a source region of the selection transistor (414 of FIG. 7). The third P-type well 533, the first gate insulation layer 541 and the floating gate 551, which are disposed in the coupling region 503, may constitute the coupling capacitor 415 of the memory cell 410 described with reference to FIG. 7. The second P-type well 532, the first gate insulation layer 541 and the floating gate 551, which are disposed in the tunneling region 501, may constitute the tunneling capacitor 416 of the memory cell 410 described with reference to FIG. 7.

For executing a program operation of the memory cell 410, a gate turn-on voltage may be applied to the word line WL and a positive program voltage may be applied to the first bias terminal CG. In addition, during programming of the memory cell 410, a negative program voltage may be applied to the second bias terminal TG and a positive bit line voltage may be applied to the bit line BL. Moreover, a ground voltage may be applied to the source line SL connected to the first P-type well 531. The positive program voltage applied to the first bias terminal CG may be provided to the third P-type well 533. In such a case, a coupling program voltage may be induced at the floating gate 551 by the positive program voltage applied to the third P-type well 533. Since the coupling program voltage may be induced at the floating gate 551, a channel inversion layer may be formed between the first P-type well contact region 562 and the first N-type contact region 563 in the tunneling region 501. Because the coupling program voltage is induced at the floating gate 551 and the negative program voltage is applied to the second P-type well 532, an electric field may be created across the first gate insulation layer 541 due to a voltage difference between the coupling program voltage and the negative program voltage. In such a case, carriers (i.e., electrons) in the channel inversion layer may be injected into the floating gate 551 through the first gate insulation layer 541 by a Fowler-Nordheim (F-N) tunneling mechanism. As a result, the memory cell 410 may be programmed.

Also, a gate turn-on voltage may be applied to the word line WL, and the selection transistor may be turned on. Thus, the cell transistor connected to the selection transistor may be selected. As the selection transistor is turned on, a channel inversion layer may be formed between the N-type drain region 565 and the N-type floated junction region 566 and the positive bit line voltage applied to the bit line BL may be provided to the N-type floated junction region 566. The coupling program voltage induced at the floating gate 551 may turn on the cell transistor. That is, a channel inversion layer may be formed between the N-type source region 564 and the N-type floated junction region 566. Thus, a current path may be created between the bit line BL and the source line SL. While the F-N tunneling phenomenon occurs in the tunneling region 501, the coupling program voltage induced at the floating gate 551 may be lowered to reduce the current that flows through the bit line BL and the source line SL.

Figure 9:
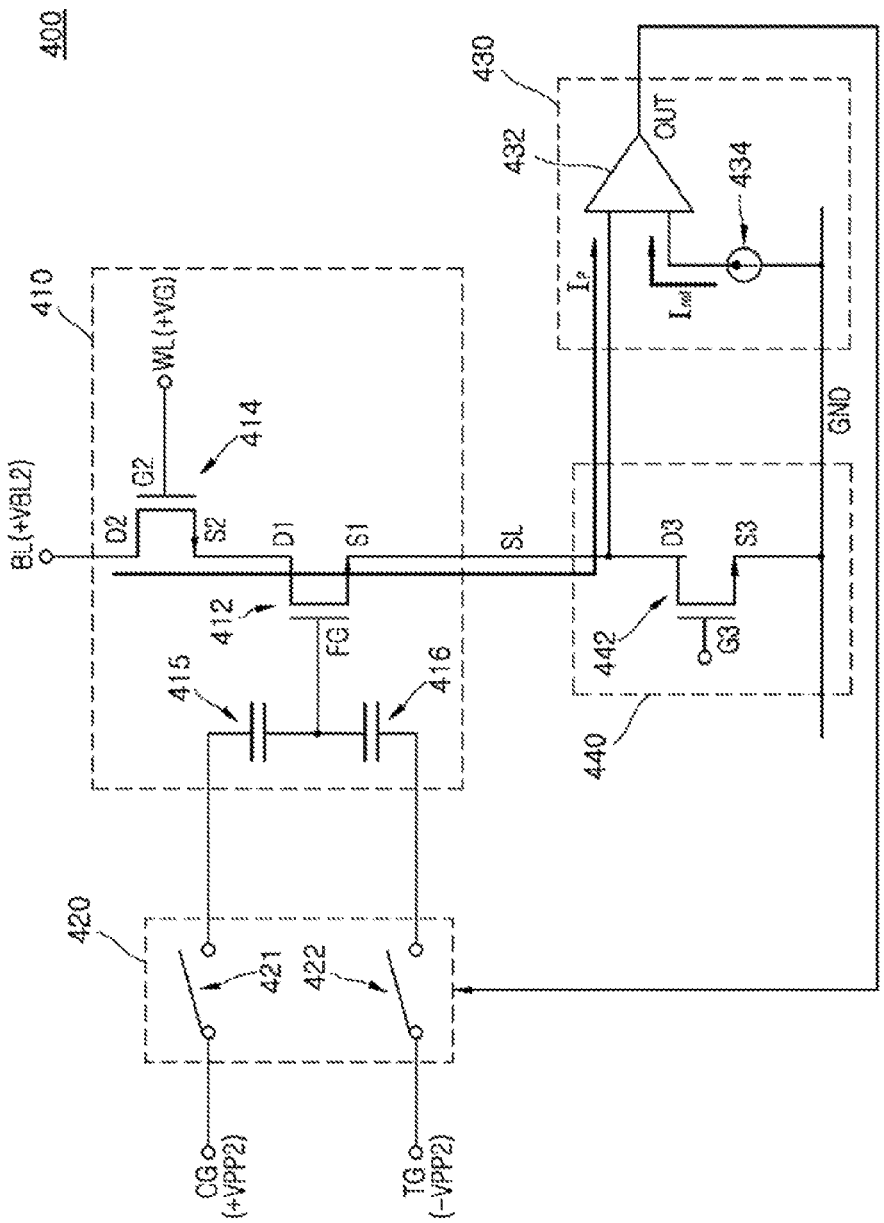
FIG. 9 is a circuit diagram illustrating a program operation of a nonvolatile memory device, according to yet another embodiment of the present disclosure.

FIG. 9 is a circuit diagram illustrating a program operation of a nonvolatile memory device according to yet another embodiment of the present disclosure. For example, the nonvolatile memory device of FIG. 9 may be the nonvolatile memory device 400 shown in FIG. 7. In FIG. 9, the same reference numerals or designators as used in FIG. 7 denote the same elements. Accordingly, detailed descriptions of the same elements as described with reference to FIG. 7 will be omitted hereinafter to avoid unnecessary duplication.

Referring to FIG. 9, for executing a program operation of the cell transistor 412, a gate turn-on voltage +VG may be applied to the word line WL connected to the gate terminal G2 of the selection transistor 414 and a program bit line voltage +VBL2 may be applied to the bit line BL. Thus, the selection transistor 414 may be turned on to select the cell transistor 412. Moreover, a positive program voltage +VPP2 may be applied to the first bias terminal CG while the first switching element 421 is switched on to electrically connect the first bias terminal CG to the coupling capacitor 415. In addition, a negative program voltage -VPP2 may be applied to the second bias terminal TG while the second switching element 422 is switched on to electrically connect the second bias terminal TG to the tunneling capacitor 416. Under the above bias condition, a coupling voltage may be induced at the floating gate FG of the cell transistor 412 by the positive program voltage +VPP2 applied to the coupling capacitor 415 and the negative program voltage -VPP2 applied to the tunneling capacitor 416. The positive program voltage +VPP2 may have the same voltage level as an absolute value of the negative program voltage -VPP2. In some embodiments, a capacitance value of the coupling capacitor 415 may be greater than a capacitance value of the tunneling capacitor 416. If the cell transistor 412 is designed to have the same configuration as the cell transistors 112 and 312 described with reference to FIGS. 1 to 6, an F-N tunneling phenomenon may occur in the tunneling capacitor 416 to program the cell transistor 412 even through the positive program voltage +VPP2 and an absolute value of the negative program voltage -VPP2 may be set to a level of one half of the positive program voltage +VPP1 described with reference to FIGS. 3 and 6. For example, if a structure including the coupling capacitor 415, the tunneling capacitor 416 and the cell transistor 112 is designed to have a coupling ratio of about 90% or higher, the positive program voltage +VPP2 may be set to about 8 volts. During programming the cell transistor 412, the N-channel MOSFET 442 of the ground connector 440 may be turned off.

During a program operation, a channel inversion layer may be formed between the drain terminal D1 and the source terminal S1 of the cell transistor 412 and a channel inversion layer may also be formed between the drain terminal D2 and the source terminal S2 of the selection transistor 414. Electrons in the channel inversion layer of the cell transistor 412 may be injected into the floating gate FG of the cell transistor 412 so that a threshold voltage of the cell transistor 412 may be increased to reach a target threshold voltage. While the electrons may be injected into the floating gate FG of the cell transistor 412, a cell current Ip may flow from the bit line BL into the first input terminal of the comparator 432 through the selection transistor 414 and the cell transistor 412. During a program operation, if a threshold voltage of the cell transistor 412 varies the current Ip may also vary. For example, if the number of the electrons injected into the floating gate FG of the cell transistor 412 increases during the program operation, the threshold voltage of the cell transistor 412 may increase to reduce the cell current Ip.

The comparator 432 may compare the cell current Ip flowing into the first input terminal with a reference current Iref flowing into the second input terminal from the constant current source 434. The reference current Iref may be set to a level corresponding to the target threshold voltage among the threshold voltages that a plurality of cell transistors including the cell transistor 412 may obtain after a program operation. If the cell current Ip is greater than the reference current Iref, the threshold voltage of the cell transistor 412 may be lower than the target threshold voltage. If the cell current Ip may be equal to the reference current Iref, the threshold voltage of the cell transistor 412 may be equal to the target threshold voltage. If the cell current Ip is less than the reference current Iref, the threshold voltage of the cell transistor 412 may be higher than the target threshold voltage.

The comparator 432 may generate the output signal OUT having a "high" logic level, while the cell current Ip is greater than the reference current Iref. In contrast, the comparator 432 may generate the output signal OUT having a "low" logic level while the cell current Ip is less than the reference current Iref. The output signal OUT having a "high" logic level may switch on the first and second switching elements 421 and 422. Thus, a positive coupling voltage may be continuously induced at the floating gate FG of the cell transistor 412, and a negative program voltage –VPP2 may be continuously applied to a terminal of the tunneling capacitor 416 opposite to the floating gate FG of the cell transistor 412. Accordingly, the cell transistor 412 may be continuously programmed. If the threshold voltage of the cell transistor 412 reaches a target threshold voltage, the output signal OUT of the comparator 432 may be generated to have a "low" logic level. In such a case, the first and second switching elements 421 and 422 may be switched off in response to the output signal OUT having a "low" logic level. Thus, the first bias terminal CG may be electrically disconnected from the coupling capacitor 415, and the second bias terminal TG may also be electrically disconnected from the tunneling capacitor 416. Accordingly, the coupling voltage may not be induced at the floating gate FG of the cell transistor 412 any more to terminate the program operation for programming the cell transistor 412. The logic levels of the output signal OUT may be set to be different according to different embodiments. For example, in some embodiments, the output signal OUT may be generated to have a "low" logic level while the cell current Ip is greater than the reference current Iref, and the output signal OUT may be generated to have a "high" logic level while the cell current Ip is less than the reference current Iref. In such a case, the first and second switching elements 421 and 422 may be switched on in response to the output signal OUT having a "low" logic level, and the first and second switching elements 421 and 422 may be switched off in response to the output signal OUT having a "high" logic level.

Figure 10:
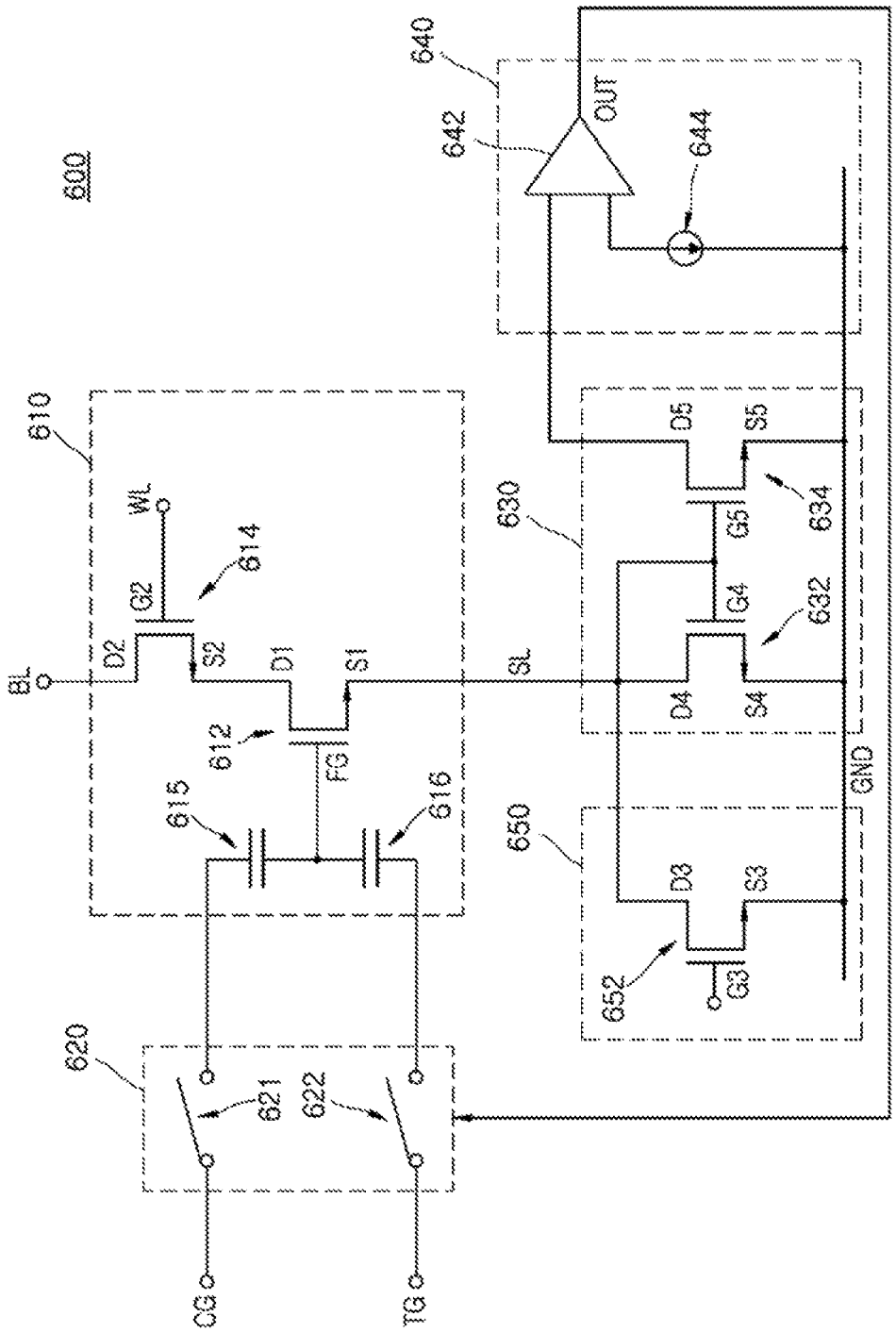
FIG. 10 is a circuit diagram illustrating a nonvolatile memory device, according to still another embodiment of the present disclosure.

FIG. 10 is a circuit diagram illustrating a nonvolatile memory device 600 according to still another embodiment of the present disclosure.

Referring to FIG. 10, the nonvolatile memory device 600 may be configured to include a memory cell 610, a switching unit 620, a current transfer unit 630, a comparing unit 640 and a ground connector 650. The memory cell 610 may include a cell transistor 612, a selection transistor 614, a coupling capacitor 615 and a tunneling capacitor 616. In some embodiments, each of the cell and selection transistors 612, 614 may be an N-channel MOSFET. The cell transistor 612 may have a floating gate FG, and the selection transistor 614 may have a gate terminal G2. A drain terminal D1 of the cell transistor 612 may be connected to a source terminal S2 of the selection transistor 614. The gate and drain terminals G2, D2 of the selection transistor 614 may be connected to a word line WL and a bit line BL, respectively. A source terminal S1 of the cell transistor 612 may be connected to a source line SL. The floating gate FG of the cell transistor 612 may be connected to common node between the coupling capacitor 615 and the tunneling capacitor 616. The coupling capacitor 615 and the tunneling capacitor 616 may be connected in parallel to the floating gate FG of the cell transistor 612. In some embodiments, each of the coupling capacitor 615 and the tunneling capacitor 616 may be implemented to have a MOS capacitor structure.

The switching unit 620 may be coupled between the memory cell 610 and a first bias terminal CG as well as between the memory cell 610 and a second bias terminal TG. The switching unit 620 may include a first switching element 621 and a second switching element 622. The first switching element 621 may be coupled between the first bias terminal CG and the other end of the coupling capacitor 615 to electrically connect the first bias terminal CG to the coupling capacitor 615 or to electrically disconnect the first bias terminal CG from the coupling capacitor 615. The second switching element 622 may be coupled between the second bias terminal TG and the other end of the tunneling capacitor 616 to electrically connect the second bias terminal TG to the tunneling capacitor 616 or to electrically disconnect the second bias terminal TG from the tunneling capacitor 616. In some embodiments, each of the first and second switching elements 621 and 622 may be implemented using a MOSFET. However, the MOSFET is merely an example of a suitable one for each of the first and second switching elements 621 and 622. That is, any switching elements having three terminals may be employed as the first and second switching elements 621 and 622. While the first switching element 621 is switched on to electrically connect the coupling capacitor 615 to the first bias terminal CG, a coupling voltage may be induced at the floating gate FG of the cell transistor 612 by a bias voltage applied to the first bias terminal CG. While the second switching element 622 is switched on to electrically connect the tunneling capacitor 616 to the second bias terminal TG, a coupling voltage may be induced at the floating gate FG of the cell transistor 612 by a bias voltage applied to the second bias terminal TG. The coupling voltage induced at the floating gate FG of the cell transistor 612 may be determined by a coupling ratio that is expressed as a function of a capacitance value of the coupling capacitor 615, a capacitance value of the tunneling capacitor 616 and a capacitance value of the cell transistor 612. While the first and second switching elements 621 and 622 are switched off to electrically disconnect the coupling capacitor 615 and the tunneling capacitor 616 from the first and second bias terminals CG and TG, respectively, no coupling voltage may be induced at the floating gate FG of the cell transistor 612.

The current transfer unit 630 may transfer a current flowing through the memory cell 610 to the comparing unit 640. The current transfer unit 630 may be implemented using a current mirror circuit that is configured to include a first MOSFET 632 and a second MOSFET 634. A gate terminal G4 of the first MOSFET 632 may be connected to a gate terminal G5 of the second MOSFET 634. A source terminal S4 of the first MOSFET 632 and a source terminal S5 of the second MOSFET 634 may be connected to a ground terminal GND in common. A drain terminal D4 of the first MOSFET 632 may be connected to the source terminal S1 of the cell transistor 612 and the gate terminal G4 of the first MOSFET 632. A drain terminal D5 of the second MOSFET 634 may be connected to the comparing unit 640. A current (Ipb of FIG. 11) flowing from the drain terminal D5 of the second MOSFET 634 toward the source terminal S5 of the second MOSFET 634 may be equal to a current (Ipa of FIG. 11) flowing from the drain terminal D4 of the first MOSFET 632 toward the source terminal S4 of the first MOSFET 632.

Figure 11:
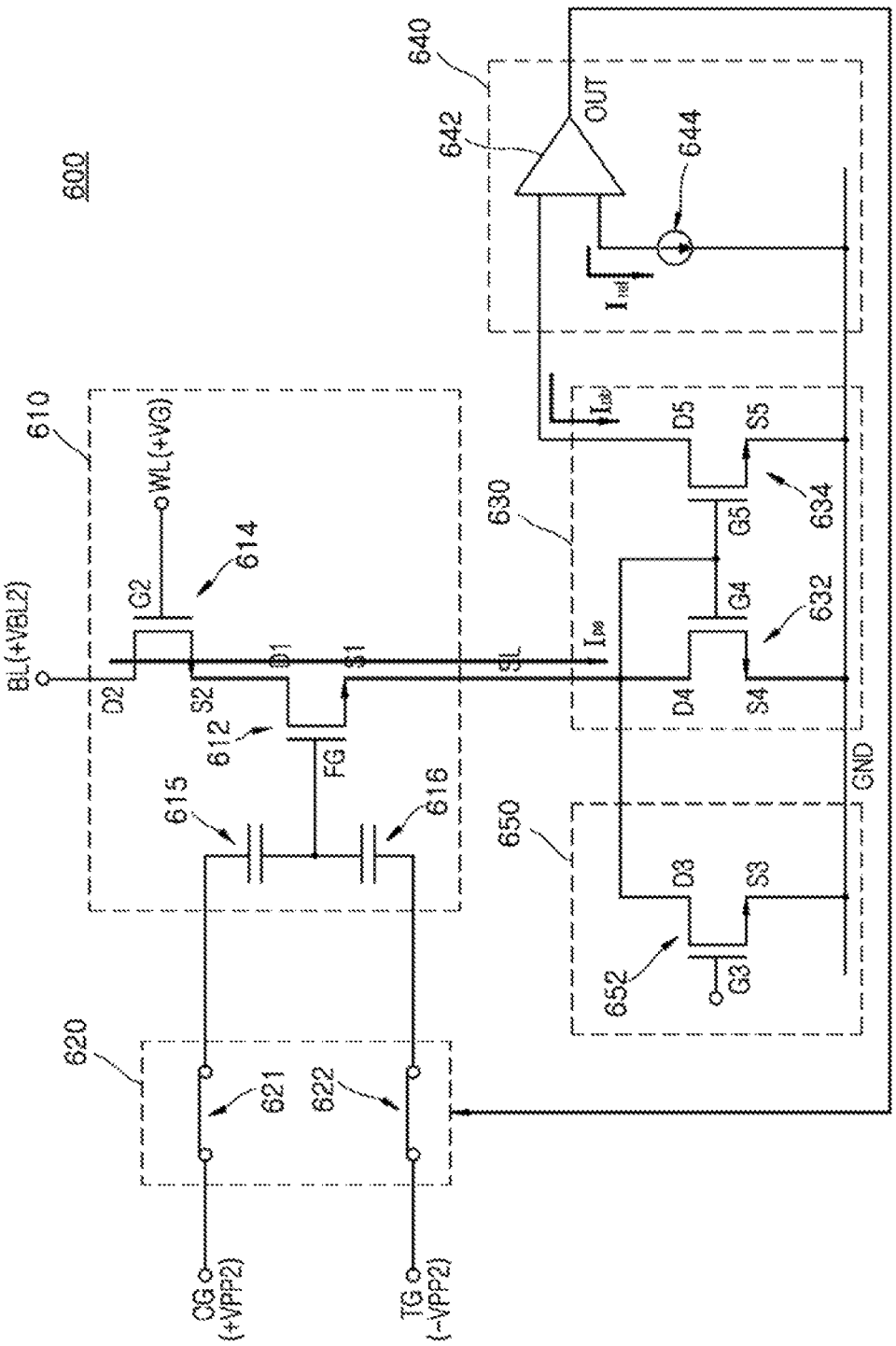
FIG. 11 is a circuit diagram illustrating a program operation of a nonvolatile memory device, according to still another embodiment of the present disclosure.

The comparing unit 640 may be configured to include a comparator 642 and a constant current source 644 generating a reference current (Iref of FIG. 11). The comparator 642 may be implemented using a current comparator that has a first input terminal, a second input terminal, and an output terminal. The first input terminal of the comparator 642 may be connected to the drain terminal D5 of the second MOSFET 634 of the current transfer unit 630. The second input terminal of the comparator 642 may be connected to the constant current source 644 generating the reference current Iref. An output terminal of the comparator 642 may be connected to the switching unit 620. The reference current Iref generated from the constant current source 644 may be set to have a current value corresponding to any one (i.e., a target threshold voltage) selected from various threshold voltages that a plurality of memory cells including the memory cell 610 (i.e., a plurality of cell transistors including the cell transistor 612) may obtain after the program operation. In some embodiments, the comparator 642 may generate an output signal OUT having a "high" logic level if a cell current Ipa (i.e., Ipb) flowing through the memory cell 610 is greater than the reference current Iref, and the comparator 642 may generate the output signal OUT having a "low" logic level if the cell current Ipa (i.e., Ipb) flowing through the memory cell 610 is less than the reference current Iref.

The first and second switching elements 621 and 622 may be switched on or off according to a logic level of the output signal OUT of the comparator 642. In some embodiments, if the cell current Ipa (i.e., Ipb) flowing through the memory cell 610 is greater than the reference current Iref, the output signal OUT of the comparator 642 may be generated to have a "high" logic level and the first and second switching elements 621 and 622 may be switched on in response to the output signal OUT having a logic "high" level. Thus, while the cell current Ipa flowing through the memory cell 610 is greater than the reference current Iref, a positive program voltage applied to the first bias terminal CG may be provided to the coupling capacitor 615 and a negative program voltage applied to the second bias terminal TG may be provided to the tunneling capacitor 616. In contrast, if the cell current Ipa flowing through the memory cell 610 is less than the reference current Iref, the output signal OUT of the comparator 642 may be generated to have a "low" logic level and the first and second switching elements 621 and 622 may be switched off in response to the output signal OUT having a "low" logic level. Thus, while the cell current Ipa flowing through the memory cell 610 is less than the reference current Iref, no bias voltage may be provided to the coupling capacitor 615 and the tunneling capacitor 616.

The ground connector 650 may be coupled between the memory cell 610 and a ground terminal GND. The ground connector 650 may be implemented using an N-channel MOSFET 652. The N-channel MOSFET 652 may have a gate terminal G3, a drain terminal D3 and a source terminal S3. The gate terminal G3 of the N-channel MOSFET 652 may receive a gate control signal, and the N-channel MOSFET 652 may be turned on or off according to a level of the gate control signal. For example, the N-channel MOSFET 652 may be turned off during the program operation and may be turned on during a read program operation. The drain terminal D3 of the N-channel MOSFET 652 may be connected to the source terminal S1 of the cell transistor 612 through the source line SL. The source terminal S3 of the N-channel MOSFET 652 may be connected to the ground terminal GND. If the N-channel MOSFET 652 is turned on, the source terminal S1 of the cell transistor 612 may be connected to the ground terminal GND through the source line SL. Thus, the source terminal S1 of the cell transistor 612 may be grounded. That is, during a read operation, the N-channel MOSFET 652 may be turned on so that the source line SL is grounded. In contrast, if the N-channel MOSFET 652 is turned off, the cell current Ipa flowing through the source line SL may be supplied to the first input terminal of the comparator 642. That is, the cell current Ipa flowing through the cell transistor 612 may be supplied to the first input terminal of the comparator 642 if the N-channel MOSFET 652 is turned off. Accordingly, since the N-channel MOSFET 652 is turned off during the program operation, the comparator 642 may compare the cell current Ipa of the cell transistor 612 with the reference current Iref to provide a uniform threshold voltage of the programmed cell transistor 612.

FIG. 11 is a circuit diagram illustrating a program operation of a nonvolatile memory device according to still another embodiment of the present disclosure. For example, the nonvolatile memory device of FIG. 11 may be the nonvolatile memory device 600 shown in FIG. 10. In FIG. 11, the same reference numerals or the same reference designators as used in FIG. 10 denote the same elements. Accordingly, detailed descriptions of the same elements as described with reference to FIG. 10 will be omitted hereinafter to avoid unnecessary duplication.

Referring to FIG. 11, in order to execute a program operation of the cell transistor 612, a gate turn-on voltage +VG may be applied to the word line WL connected to the gate terminal G2 of the selection transistor 614 and a program bit line voltage +VBL2 may be applied to the bit line BL. Thus, the selection transistor 614 may be turned on to select the cell transistor 612. Moreover, a positive program voltage +VPP2 may be applied to the first bias terminal CG while the first switching element 621 is switched on to electrically connect the first bias terminal CG to the coupling capacitor 615. In addition, a negative program voltage −VPP2 may be applied to the second bias terminal TG while the second switching element 622 is switched on to electrically connect the second bias terminal TG to the tunneling capacitor 616. Under the above bias condition, a coupling voltage may be induced at the floating gate FG of the cell transistor 612 by the positive program voltage +VPP2 applied to the coupling capacitor 615 and the negative program voltage −VPP2 applied to the tunneling capacitor 616. The positive program voltage +VPP2 may have the same voltage level as an absolute value of the negative program voltage −VPP2. In some embodiments, a capacitance value of the coupling capacitor 615 may be greater than a capacitance value of the tunneling capacitor 616. If the cell transistor 612 is designed to have the same configuration as the cell transistors 112 and 312 described with reference to FIGS. 1 to 6, an F-N tunneling phenomenon may occur in the tunneling capacitor 616 to program the cell transistor 612 even through the positive program voltage +VPP2 and an absolute value of the negative program voltage −VPP2 are set to have a level which is half of the positive program voltage +VPP1 described with reference to FIGS. 3 and 6. For example, if a structure including the coupling capacitor 615, the tunneling capacitor 616 and the cell transistor 612 is designed to have a coupling ratio of about 90% or higher, the positive program voltage +VPP2 may be set to be about 8 volts. During programming the cell transistor 612 is executed, the N-channel MOSFET 652 of the ground connector 650 may be turned off.

During the program operation, a channel inversion layer may be formed between the drain terminal D1 and the source terminal S1 of the cell transistor 612, and a channel inversion layer may also be formed between the drain terminal D2 and the source terminal S2 of the selection transistor 614. Electrons in the channel inversion layer of the cell transistor 612 may be injected into the floating gate FG of the cell transistor 612 so that a threshold voltage of the cell transistor 612 increases to reach a target threshold voltage. While the electrons are injected into the floating gate FG of the cell transistor 612, the cell current Ipa may flow from the bit line BL into the first input terminal of the comparator 642 through the selection transistor 614 and the cell transistor 612. If the threshold voltage of the cell transistor 612 varies during the program operation, an amount of the cell current Ipa may also vary. For example, if the number of the electrons injected into the floating gate FG of the cell transistor 612 increases during the program operation, the threshold voltage of the cell transistor 612 may increase to reduce the cell current Ipa.

The comparator 642 may compare the cell current Ipa (i.e., Ipb) flowing into the first input terminal with a reference current Iref flowing into the second input terminal from the constant current source 644. The reference current Iref may be set to a level corresponding to any one (i.e., a target threshold voltage) selected from various threshold voltages that a plurality of cell transistors including the cell transistor 612 may obtain after the program operation. If the cell current Ipa (i.e., Ipb) is greater than the reference current Iref, the threshold voltage of the cell transistor 612 may be lower than the target threshold voltage. If the cell current Ipa may be equal to the reference current Iref, the threshold voltage of the cell transistor 612 may be equal to the target threshold voltage. If the cell current Ipa is less than the reference current Iref, the threshold voltage of the cell transistor 612 may be higher than the target threshold voltage.

The comparator 642 may generate the output signal OUT having a logic "high" level" while the cell current Ipa is greater than the reference current Iref. In contrast, the comparator 642 may generate the output signal OUT having a "low" logic level" while the cell current Ipa is less than the reference current Iref. The output signal OUT having a logic "high" level" may switch on the first and second switching elements 621 and 622. Thus, a positive coupling voltage may be continuously induced at the floating gate FG of the cell transistor 612, and the negative program voltage −VPP2 may be continuously applied to a terminal of the tunneling capacitor 616 opposite to the floating gate FG of the cell transistor 612. Accordingly, the cell transistor 612 may be continuously programmed. If the threshold voltage of the cell transistor 612 reaches the target threshold voltage, the output signal OUT of the comparator 642 may be generated to have a "low" logic level. In such a case, the first and second switching elements 621 and 622 may be switched off in response to the output signal OUT having a "low" logic level. Thus, the first bias terminal CG may be electrically disconnected from the coupling capacitor 615, and the second bias terminal TG may also be electrically disconnected from the tunneling capacitor 616. Accordingly, the coupling voltage may not be induced at the floating gate FG of the cell transistor 612 any more to terminate the program operation for programming the cell transistor 612. The logic levels of the output signal OUT may be different according to different embodiments. For example, in some embodiments, the output signal OUT may be generated to have a "low" logic level while the cell current Ipa is greater than the reference current Iref, and the output signal OUT may be generated to have a "high" logic level while the cell current Ipa is less than the reference current Iref. In such a case, the first and second switching elements 621 and 622 may be switched on in response to the output signal OUT having a "low" logic level, and the first and second switching elements 621 and 622 may be switched off in response to the output signal OUT having a logic "high" level.

The described embodiments have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A nonvolatile memory device comprising:
   a memory cell including a cell transistor having a floating gate and a coupling capacitor connected to the floating gate; and
   a switching unit including a first terminal coupled to the coupling capacitor and a second terminal coupled to a bias terminal, and switching on or off between the coupling capacitor and the bias terminal based on a comparison result between a cell current flowing through the memory cell and a reference current during a program operation for programming the memory cell, and
   wherein the reference current has a current value corresponding to a target threshold voltage among various threshold voltages that a plurality of memory cells including the memory cell have after the program operation.

2. The nonvolatile memory device of claim 1, further comprising:
   a comparing unit suitable for comparing the cell current flowing through the memory cell with the reference current to generate an output signal during the program operation for programming the memory cell,
   wherein the switching unit is switched on or off in response to the output signal of the comparing unit.

3. The nonvolatile memory device of claim 1,
   wherein the memory cell further includes a selection transistor having a gate terminal, a source terminal connected to a drain terminal of the cell transistor, and a drain terminal; and
   wherein the gate terminal and the drain terminal of the selection transistor are connected to a word line and a bit line respectively.

4. The nonvolatile memory device of claim 1, wherein the switching unit includes at least one switching element that is switched on or off in response to the output signal of the comparing unit.

5. The nonvolatile memory device of claim 1, further comprising:
   a constant current source suitable for generating the reference current; and
   a current comparator suitable for comparing the cell current with the reference current to generate the comparison result.

6. The nonvolatile memory device of claim 5,
   wherein the output signal includes a first output signal and a second output signal;
   wherein the current comparator generates the first output signal for switching on the switching unit if the cell current is greater than the reference current; and
   wherein the current comparator generates the second output signal for switching off the switching unit if the cell current is less than the reference current.

7. The nonvolatile memory device of claim 1, further comprising:
a ground connector that is coupled between the memory cell and a ground terminal to change a potential of a source terminal of the cell transistor according to an operation mode,
wherein the operation mode includes one of a program operation and a read operation.

8. The nonvolatile memory device of claim 7, wherein the ground connector includes a MOSFET, the MOSFET having a gate terminal, a drain terminal connected to the source terminal of the cell transistor and the comparing unit, and a source terminal connected to the ground terminal.

9. The nonvolatile memory device of claim 8,
wherein the MOSFET is turned off during the program operation for programming the memory cell; and
wherein the MOSFET is turned on during the read operation for reading out a datum of the memory cell.

10. The nonvolatile memory device of claim 2, further comprising:
a current transfer unit suitable for transferring the cell current to the comparing unit.

11. The nonvolatile memory device of claim 10,
wherein the current transfer unit includes a first MOSFET and a second MOSFET whose gate terminals are connected to each other;
wherein source terminals of the first and second MOSFETs are connected to a ground terminal;
wherein a drain terminal of the first MOSFET is connected to a source terminal of the cell transistor and the gate terminal of the first MOSFET; and
wherein a drain terminal of the second MOSFET is connected to the comparing unit.

12. The nonvolatile memory device of claim 11, wherein the comparing unit includes:
a constant current source suitable for generating the reference current; and
a current comparator having a first input terminal connected to the drain terminal of the second MOSFET, a second input terminal connected to the constant current source, and an output terminal.

13. The nonvolatile memory device of claim 11, further comprising:
a ground connector that is coupled between the memory cell and the ground terminal to change a potential of a source terminal of the cell transistor according to an operation mode,
wherein the operation mode includes one of a program operation and a read operation,
wherein the ground connector includes a MOSFET,
wherein the MOSFET has a gate terminal, a drain terminal connected to the source terminal of the cell transistor and the drain terminal of the first MOSFET, and a source terminal connected to the ground terminal,
wherein the MOSFET is turned off during the program operation for programming the memory cell, and
wherein the MOSFET is turned on during the read operation for reading out a datum of the memory cell.

14. The nonvolatile memory device of claim 2,
wherein the memory cell further includes a tunneling capacitor connected to the floating gate; and
wherein the tunneling capacitor and the coupling capacitor are connected in parallel to the floating gate.

15. The nonvolatile memory device of claim 14,
wherein the bias terminal is a first bias terminal,
wherein the switching unit includes:
a first switching element coupled between the coupling capacitor and the first bias terminal; and
a second switching element coupled between the tunneling capacitor and a second bias terminal, and
wherein the first and second switching elements are switched on or off according to the output signal.

16. The nonvolatile memory device of claim 14, further comprising a current transfer unit suitable for transferring the cell current to the comparing unit.

17. The nonvolatile memory device of claim 16,
wherein the current transfer unit includes a first MOSFET and a second MOSFET whose gate terminals are connected to each other;
wherein source terminals of the first and second MOSFETs are connected to a ground terminal;
wherein a drain terminal of the first MOSFET is connected to a source terminal of the cell transistor and the gate terminal of the first MOSFET; and
wherein a drain terminal of the second MOSFET is connected to the comparing unit.

18. The nonvolatile memory device of claim 16, wherein the comparing unit includes:
a constant current source suitable for generating the reference current; and
a current comparator having a first input terminal connected to the drain terminal of the second MOSFET, a second input terminal connected to the constant current source, and an output terminal.

19. The nonvolatile memory device of claim 17, further comprising:
a ground connector that is coupled between the memory cell and the ground terminal to change a potential of a source terminal of the cell transistor according to an operation mode,
wherein the operation mode includes one of a program operation and a read operation,
wherein the ground connector includes a MOSFET,
wherein the MOSFET has a gate terminal, a drain terminal connected to the source terminal of the cell transistor and the drain terminal of the first MOSFET, and a source terminal connected to the ground terminal,
wherein the MOSFET is turned off during the program operation for programming the memory cell, and
wherein the MOSFET is turned on during the read operation for reading out a datum of the memory cell.

* * * * *